(12) United States Patent
Kim et al.

(10) Patent No.: US 12,369,421 B2
(45) Date of Patent: Jul. 22, 2025

(54) IMAGE SENSOR AND METHOD OF FABRICATING SAME

(71) Applicant: Samsung Electronics Co., Ltd., Suwon-si (KR)

(72) Inventors: Jinyoung Kim, Ulsan (KR); Euiyeol Kim, Yongin-si (KR); Hyounmin Baek, Yongin-si (KR); Jeong-Ho Lee, Seoul (KR); Youngwoo Chung, Yongin-si (KR); Heegeun Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/306,006

(22) Filed: Apr. 24, 2023

(65) Prior Publication Data

US 2023/0261024 A1    Aug. 17, 2023

Related U.S. Application Data

(63) Continuation of application No. 16/934,278, filed on Jul. 21, 2020, now Pat. No. 11,670,661.

(30) Foreign Application Priority Data

Dec. 20, 2019  (KR) .......................... 10-2019-0171635
Apr. 7, 2020   (KR) .......................... 10-2020-0042280

(51) Int. Cl.
  *H10F 39/00*  (2025.01)

(52) U.S. Cl.
  CPC ......... *H10F 39/807* (2025.01); *H10F 39/014* (2025.01); *H10F 39/802* (2025.01);
  (Continued)

(58) Field of Classification Search
  CPC .......... H01L 27/1463; H01L 27/14603; H01L 27/14621; H01L 27/14627;
  (Continued)

(56) References Cited

U.S. PATENT DOCUMENTS 4,493,740 A * 1/1985 Komeda ........... H01L 21/76227
                                         438/432
4,631,803 A * 12/1986 Hunter .............. H01L 21/76202
                                         257/520
(Continued)

FOREIGN PATENT DOCUMENTS

CN       1979885 A    6/2007
CN     109216389 A    1/2019
(Continued)

*Primary Examiner* — Eugene Lee
(74) *Attorney, Agent, or Firm* — Fish & Richardson P.C.

(57) ABSTRACT

An image sensor includes: a substrate having a first surface and an opposing second surface and including unit pixels respectively having photoelectric conversion regions, a semiconductor pattern disposed in a first trench defining the unit pixels, the semiconductor pattern including a first semiconductor layer provided on an inner surface of the first trench and a second semiconductor layer provided on the first semiconductor layer, and a first contact provided on the second surface and connected to the semiconductor pattern. A height of the first semiconductor layer from a bottom surface of the first trench is less than a height of the second semiconductor layer from the bottom surface of the first trench.

20 Claims, 20 Drawing Sheets

(52) U.S. Cl.
CPC ..... *H10F 39/8053* (2025.01); *H10F 39/8063* (2025.01); *H10F 39/811* (2025.01)

(58) Field of Classification Search
CPC ............. H01L 27/14636; H10F 39/807; H10F 39/014; H10F 39/802; H10F 39/8053; H10F 39/8063; H10F 39/811
See application file for complete search history.

(56) References Cited

U.S. PATENT DOCUMENTS

| | | | | |
|---|---|---|---|---|
| 4,689,656 | A * | 8/1987 | Silvestri | H01L 21/02381 257/E21.538 |
| 4,819,052 | A * | 4/1989 | Hutter | H01L 21/743 438/234 |
| 4,835,115 | A * | 5/1989 | Eklund | H01L 21/763 438/433 |
| 5,106,777 | A * | 4/1992 | Rodder | H01L 21/763 257/E21.572 |
| 6,277,709 | B1 * | 8/2001 | Wang | H01L 21/763 257/E21.546 |
| 6,720,638 | B2 * | 4/2004 | Tran | H01L 21/76224 257/E21.546 |
| 6,750,526 | B2 * | 6/2004 | Nakashima | H01L 21/763 257/E21.375 |
| 7,446,367 | B2 | 11/2008 | Kim et al. | |
| 7,479,440 | B2 * | 1/2009 | Smythe, III | H01L 21/76224 257/E21.546 |
| 7,732,247 | B2 | 6/2010 | Mouli et al. | |
| 8,258,028 | B2 * | 9/2012 | Tilke | H10B 41/40 438/296 |
| 8,552,524 | B2 * | 10/2013 | Schuler | H01L 21/76232 257/E21.548 |
| 8,664,578 | B2 | 3/2014 | Hirigoyen et al. | |
| 8,853,811 | B2 | 10/2014 | Lai et al. | |
| 8,884,440 | B2 | 11/2014 | Kim et al. | |
| 9,373,656 | B2 | 6/2016 | Park | |
| 9,524,995 | B2 | 12/2016 | Koo et al. | |
| 9,704,904 | B2 | 7/2017 | Lai et al. | |
| 10,096,637 | B2 | 10/2018 | Chung et al. | |
| 10,134,792 | B2 | 11/2018 | Lee et al. | |
| 10,692,936 | B2 | 6/2020 | Zhang | |
| 10,784,303 | B2 * | 9/2020 | Chen | H01L 27/14654 |
| 10,930,739 | B2 | 2/2021 | Choi et al. | |
| 2002/0190282 | A1 * | 12/2002 | Calafut | H01L 29/7802 257/E29.152 |
| 2003/0089961 | A1 * | 5/2003 | Vollrath | H01L 21/763 257/E21.574 |
| 2007/0131987 | A1 | 6/2007 | Kim | |
| 2009/0026586 | A1 * | 1/2009 | Anderson | H01L 29/0653 257/E21.135 |
| 2014/0374868 | A1 | 12/2014 | Lee et al. | |
| 2015/0014807 | A1 * | 1/2015 | Chuang | H01L 29/0649 438/430 |
| 2015/0097245 | A1 * | 4/2015 | Lu | H01L 21/76237 438/424 |
| 2017/0207267 | A1 | 7/2017 | Park et al. | |
| 2017/0243915 | A1 | 8/2017 | Chou et al. | |
| 2018/0061873 | A1 | 3/2018 | Lee et al. | |
| 2018/0190691 | A1 | 7/2018 | Lee et al. | |
| 2018/0331135 | A1 | 11/2018 | Lee et al. | |
| 2019/0181174 | A1 | 6/2019 | Fang et al. | |
| 2020/0006410 | A1 | 1/2020 | Wu et al. | |
| 2020/0266221 | A1 | 8/2020 | Uchida et al. | |
| 2020/0303507 | A1 * | 9/2020 | Yilmaz | H01L 29/4236 |
| 2021/0366956 | A1 | 11/2021 | Wu et al. | |
| 2022/0336511 | A1 | 10/2022 | Barbour et al. | |

FOREIGN PATENT DOCUMENTS

| | | |
|---|---|---|
| CN | 110010613 A | 7/2019 |
| CN | 110197833 A | 9/2019 |
| KR | 10-0190000 | 1/1999 |
| KR | 2014-0108940 A | 9/2014 |
| KR | 2015-0105076 A | 9/2015 |
| KR | 2018-0024072 A | 3/2018 |

* cited by examiner

IMAGE SENSOR AND METHOD OF FABRICATING SAME

CROSS-REFERENCE TO RELATED APPLICATIONS

This U.S. non-provisional patent application is a continuation of U.S. application Ser. No. 16/934,278, filed Jul. 21, 2020, which claims priority under 35 U.S.C. § 119 to Korean Patent Application Nos. 10-2019-0171635 and 10-2020-0042280 respectively filed on Dec. 20, 2019, and Apr. 7, 2020, in the Korean Intellectual Property Office, each of which is hereby incorporated by reference.

BACKGROUND

The inventive concept relates to image sensors, and more particularly, to complementary metal-oxide semiconductor (CMOS) image sensors.

An image sensor is an electronic device that converts electromagnetic energy (e.g., incident light) into corresponding electrical signals. With the recent developments in computer and communications industries, a demand has arisen for high-performance image sensors across a variety of applications such as; digital cameras, camcorders, personal communication systems, gaming machines, security cameras, micro-cameras for medical applications, robots, etc.

The image sensors may be generally classified into charge-coupled-device (CCD) and complementary metal-oxide-semiconductor (CMOS) image sensors. Since CMOS image sensors have a relatively simple operating method and may be fabricated on a single semiconductor chip together with signal processing circuits, it is possible to reduce the size of many products incorporating the CMOS image sensor(s). In addition, since CMOS image sensors operate with relatively low power consumption, they may be readily incorporated into electronic devices powered by a battery. Furthermore, CMOS image sensors may be fabricated using well-known CMOS fabrication techniques, and thus, it is possible to reduce manufacturing costs. Moreover, CMOS image sensors provide high resolution images. Accordingly, the use of CMOS image sensors is rapidly increasing.

SUMMARY

Embodiments of the inventive concept provide an image sensor having improved reliability.

According to embodiments of the inventive concept, an image sensor may include; a substrate having a first surface and an opposing second surface and including unit pixels respectively having photoelectric conversion regions, a semiconductor pattern disposed in a first trench defining the unit pixels, the semiconductor pattern including a first semiconductor layer provided on an inner surface of the first trench and a second semiconductor layer provided on the first semiconductor layer, and a first contact provided on the second surface and connected to the semiconductor pattern, wherein a height of the first semiconductor layer from a bottom surface of the first trench is less than a height of the second semiconductor layer from the bottom surface of the first trench.

According to embodiments of the inventive concept, an image sensor may include; a substrate having a first surface and an opposing second surface and including a plurality of unit pixels, color filters and micro lenses provided on the second surface of the substrate, a pixel isolation pattern disposed in a first trench defining the unit pixels and penetrating the substrate, the pixel isolation pattern including a first oxide layer covering an inner surface of the first trench, a first semiconductor layer, and a second semiconductor layer, and a first contact connected to the first and second semiconductor layers, wherein the first semiconductor layer has a first side surface and an opposing second side surface, and a distance between the first and second side surfaces in a horizontal direction increases with decreasing distance to the first surface of the substrate.

According to embodiments of the inventive concept, an image sensor may include; a substrate having a first surface and an opposing second surface and including a pixel region with a plurality of unit pixels, an optically black region, and a pad region, a pixel isolation pattern filling a first trench of the substrate and defining the unit pixels, the pixel isolation pattern including a first oxide layer covering an inner surface of the first trench, a first semiconductor layer, and a second semiconductor layer, color filters provided on the second surface of the substrate, micro lenses provided on the color filters, transfer transistors and logic transistors provided on the first surface, a device isolation pattern provided adjacent to the first surface to fill a second trench of the substrate, an interlayer insulating layer provided on the first surface, interconnection lines provided in the interlayer insulating layer and electrically connected to the transfer and logic transistors, a first light-blocking pattern and a first contact provided on the optically black region, and a second light-blocking pattern and a second contact provided on the pad region. The first contact is connected to the first light-blocking pattern and the first and second semiconductor layers.

According to embodiments of the inventive concept, a method of fabricating an image sensor may include; preparing a substrate having a first surface and an opposing second surface including a pixel region, an optically black region, and a pad region, performing an etching process on the substrate to form a first trench, and forming a pixel isolation pattern to fill an inner space of the first trench. The forming of the pixel isolation pattern may include; depositing a first oxide layer to cover an inner surface of the first trench, depositing a first preliminary semiconductor layer to cover the first oxide layer, performing a first etching process on the first preliminary semiconductor layer to form a first semiconductor layer, and depositing a second semiconductor layer to fill the inner space of the first trench.

According to embodiments of the inventive concept, an image sensor may include; a substrate having a first surface and an opposing second surface and including unit pixels with a plurality of photoelectric conversion regions, a pixel isolation pattern disposed in a first trench defining the unit pixels, the pixel isolation pattern comprising a first oxide layer covering an inner surface of the first trench, a first semiconductor layer, and a second semiconductor layer, and a device isolation pattern disposed adjacent to the first surface of the substrate, wherein the second semiconductor layer includes a first portion and a second portion and vertically extends toward the second surface of the substrate, the second portion is spaced apart from the first oxide layer by the first semiconductor layer interposed therebetween, and the first and second semiconductor layers comprise poly silicon.

BRIEF DESCRIPTION OF THE DRAWINGS

Example embodiments may be more clearly understood upon consideration of following brief description taken in conjunction with the accompanying drawings. The accompanying drawings represent non-limiting, example embodiments as described herein.

Figure 1:
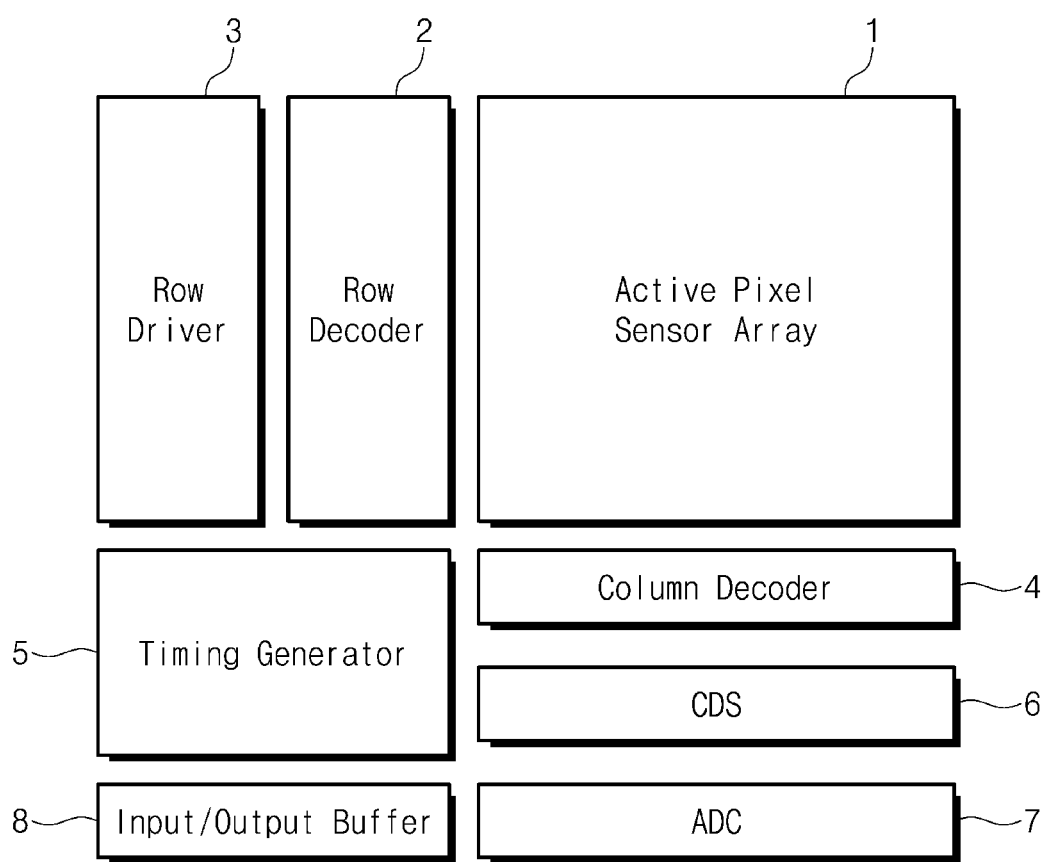
FIG. 1 is a block diagram illustrating an image sensor according to embodiments of the inventive concept.

Here, it should be noted that these figures are intended to illustrate the general characteristics of methods, structure and/or materials utilized in certain example embodiments and to supplement the written description provided below. However, the drawings are not drawn to scale and may not reflect the precise structural or performance characteristics of certain embodiments, and should not be interpreted as defining or limiting a range of values or properties encompassed by example embodiments. For example, the relative thicknesses and disposition of material layers, regions and/or structural elements may be reduced or exaggerated in the drawings for clarity. Throughout the written description and drawings, like reference numbers and labels are used to denote like or similar elements and/or features. Throughout the written description certain geometric terms may be used to highlight certain relative relationships between elements, components and/or features with respect to certain embodiments of the inventive concept. Those skilled in the art will recognize that such geometric terms are relative in nature, arbitrary in descriptive relation and/or directed to aspect(s) of the illustrated embodiments. Geometric terms may include, for example: height/width; vertical/horizontal; closer/farther; proximate/distant; above/below; under/over; upper/lower; uppermost/lowermost; center/edge; surround; periphery; overlap/underlay; beside; parallel, etc.

DETAILED DESCRIPTION

Figure (FIG. 1 is a block diagram illustrating an image sensor according to embodiments of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output buffer 8.

The active pixel sensor array 1 may include a plurality of unit pixels, which are two-dimensionally arranged, and may convert an optical signal to an electrical signal. The active pixel sensor array 1 may be driven by a plurality of driving signals, such as a pixel selection signal, a reset signal, and a charge transfer signal, which are transmitted from the row driver 3. In addition, the converted electrical signal may be provided to the correlated double sampler 6.

The row driver 3 may provide the driving signals for driving the plurality of unit pixels to the active pixel sensor array 1, based on the result decoded by the row decoder 2. When the unit pixels are arranged in a matrix form (i.e., in rows and columns), the driving signals may be provided to respective rows.

The timing generator 5 may provide timing and control signals to the row decoder 2 and the column decoder 4.

The CDS 6 may receive the electric signals, which are generated by the active pixel sensor array 1, and may perform an operation of holding and sampling the received electric signals. For example, in the CDS 6, a double sampling operation on a specific noise level and a signal level of the electric signal may be performed to output a difference level corresponding to a difference between the noise and signal levels.

The ADC 7 may convert an analog signal, which corresponds to the difference level outputted from the CDS 6, to a digital signal and may output the converted digital signal.

The input/output buffer 8 may latch the digital signal, and the latched digital signal may be sequentially output to an image signal processing part (not shown), based on the result decoded by the column decoder 4.

Figure 2:
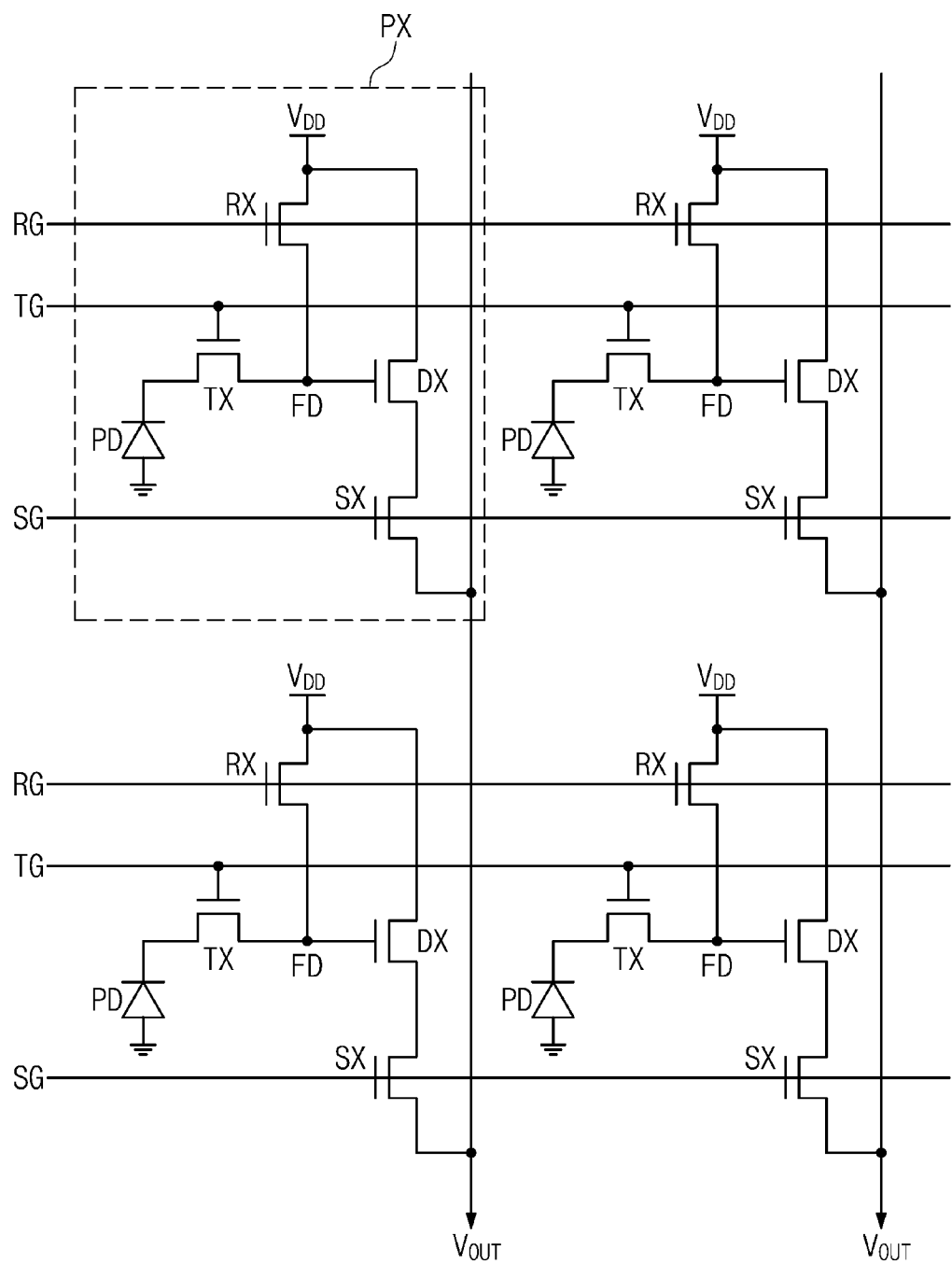
FIG. 2 is a circuit diagram of an active pixel sensor array of an image sensor according to embodiments of the inventive concept.

FIG. 2 is a circuit diagram illustrating in one example an active pixel sensor array of an image sensor according to embodiments of the inventive concept.

Referring to FIGS. 1 and 2, the active pixel sensor array 1 may include a plurality of unit pixels PX, which are arranged in a matrix shape. Each of the unit pixels PX may include a transfer transistor TX and logic transistors RX, SX, and DX. The logic transistors may include a reset transistor RX, a selection transistor SX, and a drive transistor DX. The transfer transistor TX may include a transfer gate TG. Each of the unit pixels PX may further include a photoelectric conversion device PD and a floating diffusion region FD.

The photoelectric conversion device PD may generate and store photo-charge, in proportional to an amount of light that is incident from the outside. The photoelectric conversion device PD may include a photo diode, a photo transistor, a photo gate, a pinned photo diode, or any combination thereof. The transfer transistor TX may transfer electric charge, which are generated in the photoelectric conversion device PD, to the floating diffusion region FD. The charge generated in the photoelectric conversion device PD may be transferred to and cumulatively stored in the floating diffusion region PD. The drive transistor DX may be controlled by an amount of the photo-charge stored in the floating diffusion region FD.

The reset transistor RX may periodically discharge the photo-charge stored in the floating diffusion region FD. The reset transistor RX may include a drain electrode, which is connected to the floating diffusion region FD, and a source electrode, which is connected to a power voltage VDD. If the reset transistor RX is turned ON, the power voltage VDD connected to the source electrode of the reset transistor RX may be applied to the floating diffusion region FD. Accordingly, if the reset transistor RX is turned ON, the electric charge stored in the floating diffusion region FD may be discharged through the reset transistor RX, and as a result, the floating diffusion region FD may be reset.

The drive transistor DX may serve as a source follower buffer amplifier. The drive transistor DX may amplify a variation in electric potential of the floating diffusion region FD and may output the amplified signal to an output line Vout.

The selection transistor SX may select a row of the unit pixels P to be read. If the selection transistor SX is turned ON, the power voltage VDD may be applied to a drain electrode of the drive transistor DX.

Figure 3:
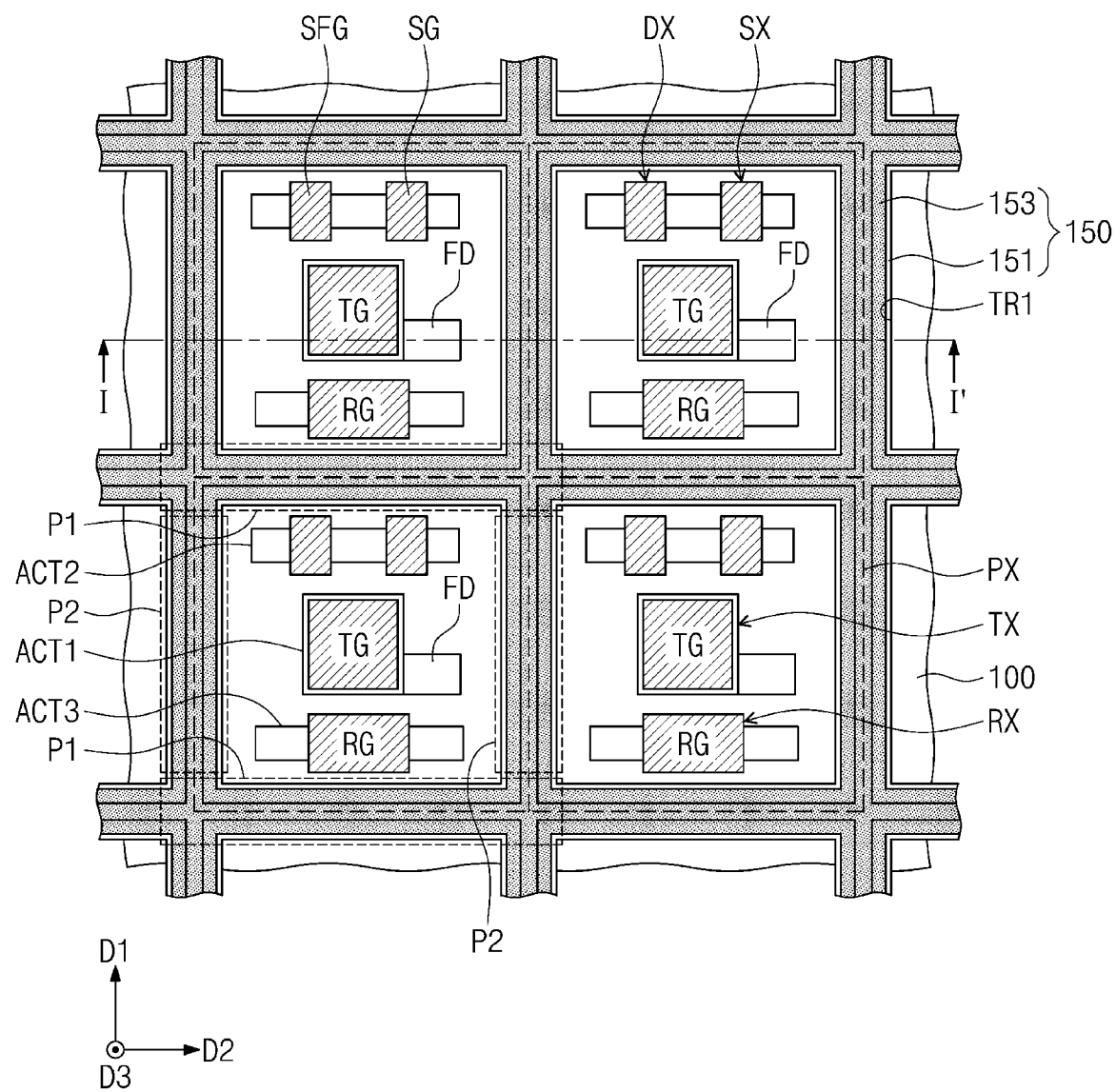
FIG. 3 is a plan view illustrating an image sensor according to embodiments of the inventive concept.
Figure 4:
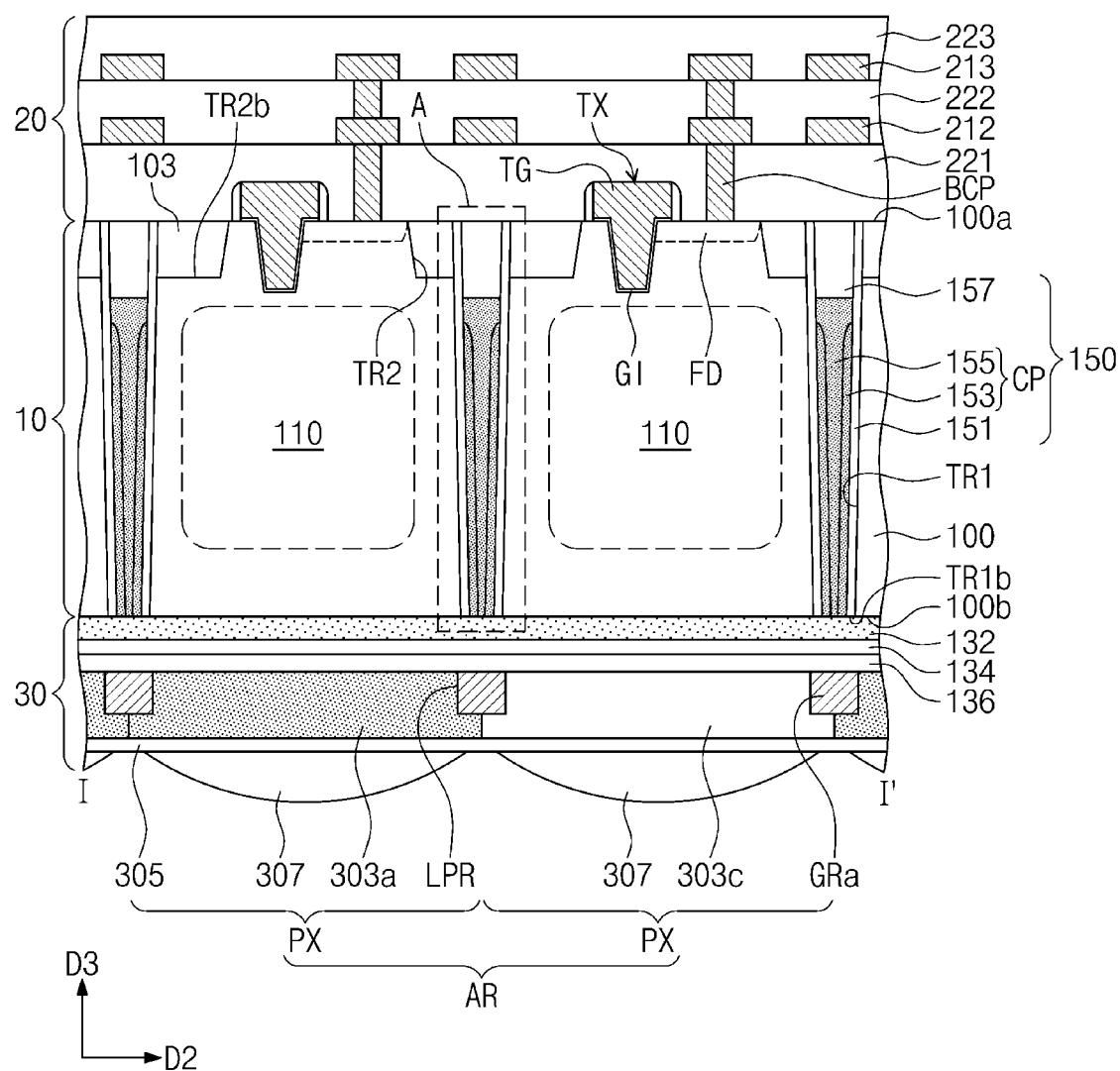
FIG. 4 is a sectional view taken along a line I-I' of FIG. 3.

FIG. 3 is a plan view illustrating an image sensor according to embodiments of the inventive concept, and FIG. 4 is a sectional view taken along a line I-I' of FIG. 3.

Referring to FIGS. 3 and 4, the image sensor according to embodiments of the inventive concept may include a photoelectric conversion layer 10, an interconnection layer 20, and an optically-transparent layer 30. When viewed in a vertical sectional view, the photoelectric conversion layer 10 may be disposed between the interconnection layer 20 and the optically-transparent layer 30. The photoelectric conversion layer 10 may include a substrate 100, a pixel isolation pattern 150, a device isolation pattern 103, and photoelectric conversion regions 110, which are provided in the substrate 100. In the photoelectric conversion regions 110, incident light may be converted to electrical signals.

The substrate 100 may have a first or front surface 100a and an opposing second or rear surface 100b. The interconnection layer 20 may be disposed on the first surface 100a of the substrate 100, and the optically-transparent layer 30 may be disposed on the second surface 100b of the substrate 100.

The interconnection layer 20 may include the transfer transistors TX, the logic transistors RX, SX, and DX, insulating layers 222 and 223, and interconnection lines 212 and 213. The transfer transistors TX may be electrically connected to the photoelectric conversion regions 110. The interconnection lines 212 and 213 may be vertically connected to the transfer transistors TX and the logic transistors RX, SX, and DX through vias VI. Electrical signals, which are converted in the photoelectric conversion regions 110, may be processed in the interconnection layer 20. The interconnection lines 212 and 213 may be disposed in the interlayer insulating layers 222 and 223 stacked on the first surface 100a of the substrate 100. In an embodiment, the interconnection lines 212 and 213 may be arranged, regardless of the arrangement of the photoelectric conversion regions 110. For example, the interconnection lines 212 and 213 may be disposed to cross over the photoelectric conversion regions 110.

The optically-transparent layer 30 may include color filters 303 and micro lenses 307. The optically-transparent layer 30 may perform a condensing and filtering operation on light, which is incident from the outside, and may provide the light to the photoelectric conversion layer 10.

The substrate 100 may include a bulk silicon wafer and an epitaxial layer formed thereon, and in an embodiment, the bulk silicon wafer and the epitaxial layer may have a first conductivity type (e.g., P-type). Here, according to the process of fabricating the image sensor, a bulk silicon wafer may be removed from the substrate 100, and only the P-type epitaxial layer may be left. In addition, the substrate 100 may be a bulk semiconductor wafer, in which a well region of the first conductivity type is provided. In certain embodiments, various kinds of substrates (e.g., an N-type epitaxial layer, a bulk silicon wafer, and a silicon-on-insulator (SOI) wafer) may be used as the substrate 100.

The substrate 100 may include the unit pixels PX, which are defined by the pixel isolation pattern 150. The unit pixels PX may be arranged in a first direction D1 and a second direction D2 crossing each other or in a matrix pattern. The pixel isolation pattern 150 may prevent photo-charge, which are generated in response to light incident into each of the unit pixels PX, from entering neighboring unit pixels PX through a random drift. In other words, the pixel isolation pattern 150 may prevent a cross-talk phenomenon from occurring between the unit pixels PX.

When viewed in a plan view, the pixel isolation pattern 150 may have a lattice or grid structure. When viewed in a plan view, the pixel isolation pattern 150 may be provided to completely enclose each of the unit pixels PX. For example, the pixel isolation pattern 150 may include first portions P1, which are extended in the second direction D2 and are spaced apart in the first direction D1, and second portions P2, which are extended in the first direction D1 and are spaced apart in the second direction D2. Each of the unit pixels PX may be defined as a pair of the first portions P1 and a pair of the second portions P2. In other words, each of the unit pixels PX may be enclosed by a pair of the first portions P1 and a pair of the second portions P2.

As shown in a cross-sectional view taken along the second and third directions D2 and D3, the pixel isolation pattern 150 may be extended from the first surface 100a of the substrate 100 toward the second surface 100b. In an embodiment, the pixel isolation pattern 150 may be provided to penetrate the substrate 100. For example, a vertical height of the pixel isolation pattern 150 may be substantially equal to a vertical thickness of the substrate 100. As an example, a width of the pixel isolation pattern 150 may decrease in a direction from the first surface 100a of the substrate 100 toward the second surface 100b. The pixel isolation pattern 150 will be described in some additional detail hereafter with reference to FIGS. 4, 5, 6, 7 and 8.

The photoelectric conversion regions 110 may be disposed in the unit pixels PX, respectively. The photoelectric conversion regions 110 may be doped to have a conductivity type (e.g., a second conductivity type or N-type) that is different from that of the substrate 100. The photoelectric conversion regions 110 may be adjacent to the first surface 100a of the substrate 100. The photoelectric conversion regions 110 may be disposed to be closer to the first surface 100a than to the second surface 100b.

Each of the photoelectric conversion regions 110 may include a first region adjacent to the first surface 100a and a second region adjacent to the second surface 100b. There may be difference(s) in the impurity concentrations between the first and second regions of the photoelectric conversion region 110. This may lead to a non-vanishing gradient of potential in the photoelectric conversion region 110 between the first surface 100a and the second surface 100b of the substrate 100.

The substrate 100 and the photoelectric conversion region 110 may constitute a photodiode. For example, the substrate 100 of the first conductivity type and the photoelectric conversion region 110 of the second conductivity type may constitute a P-N junction serving as the photodiode. The photoelectric conversion region 110 constituting the photodiode may generate and/or accumulate photo-charge in proportion to the intensity of incident light.

The device isolation pattern 103 may be provided on the first surface 100a of the substrate 100 to define first active patterns ACT1, second active patterns ACT2, and third active patterns ACT3. The device isolation pattern 103 may have a width gradually decreasing in a direction from the first surface 100a of the substrate 100 towards the second surface 100b. A bottom surface of the device isolation pattern 103 may be vertically spaced apart from the photoelectric conversion regions 110. A level of the bottom surface of the device isolation pattern 103 may be a first level lv1. A depth of the device isolation pattern 103 may be less than a depth of the pixel isolation pattern 150. The pixel isolation pattern 150 may be overlapped with a portion of the device isolation pattern 103.

Each of the unit pixels PX may include the first active pattern ACT1 defined by the device isolation pattern 103. For example, when viewed in a plan view, the first active pattern ACT1 may be disposed in a center region of each of the unit pixels PX. The first active pattern ACT1 may have a 'L'-shaped planar shape. Each of the unit pixels PX may include the second active pattern ACT2 or the third active pattern ACT3. The second active pattern ACT2 and the third active pattern ACT3 may be defined by the device isolation pattern 103. When viewed in a plan view, each of the second and third active patterns ACT2 and ACT3 may be disposed in an edge region of each of the unit pixels PX. Each of the second and third active patterns ACT2 and ACT3 may have a line shape extending in the second direction D2. However, the planar shapes of the first to third active patterns ACT1, ACT2, and ACT3 may not be limited to the example shown in FIG. 3 and may be variously changed.

Alternately, each of the unit pixels PX may include the first active pattern ACT1, the second active pattern ACT2, and the third active pattern ACT3. The first active pattern ACT1, the second active pattern ACT2, and the third active pattern ACT3 may be disposed to be spaced apart from each other. The first active pattern ACT1, the second active pattern ACT2, and the third active pattern ACT3 may have different sizes. The first active pattern ACT1 may be disposed between the second active pattern ACT2 and the third active pattern ACT3.

The transfer transistors TX and the logic transistors RX, SX, and DX previously described with reference to FIG. 2 may be provided on the first surface 100a of the substrate 100. The transfer transistor TX may be provided on the first active pattern ACT1 of each of the unit pixels PX. The transfer transistor TX may be electrically connected to the photoelectric conversion region 110. The transfer transistor TX may include the transfer gate TG, which is provided on the first active pattern ACT1, and the floating diffusion region FD. The transfer gate TG may include a lower portion, which is inserted in the substrate 100, and an upper portion, which is connected to the lower portion and is formed to protrude above the first surface 100a of the substrate 100. A gate dielectric layer GI may be interposed between the transfer gate TG and the substrate 100. The floating diffusion region FD may be formed in a region of the first active pattern ACT1 that is located at a side of the transfer gate TG. The floating diffusion region FD may be doped to have the second conductivity type (e.g., N-type) different from the conductivity type of the substrate 100.

The drive transistor DX and the selection transistor SX may be provided on the second active pattern ACT2 of each of the unit pixels PX. The drive transistor DX may include a drive gate SFG, which is provided on the second active pattern ACT2, and the selection transistor SX may include a selection gate SG. The reset transistor RX may be provided on the third active pattern ACT3 of each of the unit pixels PX. The reset transistor RX may include a reset gate RG, which is provided on the third active pattern ACT3. The gate dielectric layer GI may be interposed between each of the drive, selection, and reset gates SFG, SG, and RG and the substrate 100.

The interconnection layer 20 may include first to third interlayer insulating layers 221, 222, and 223 and the first and second interconnection lines 212 and 213. The first interlayer insulating layer 221 may be provided on the first surface 100a of the substrate 100 to cover the transfer transistors TX and the logic transistors RX, SX, and DX. The first and second interconnection lines 212 and 213 may be respectively provided in the second and third interlayer insulating layers 222 and 223, which are stacked on the first interlayer insulating layer 221.

The first and second interconnection lines 212 and 213 may be electrically connected to the transfer transistors TX and the logic transistors RX, SX, and DX through contacts BCP, which are provided to penetrate the first interlayer insulating layer 221. In an embodiment, the first and second interconnection lines 212 and 213 may be disposed, regardless of the arrangement of the photoelectric conversion regions 110. When viewed in a plan view, the first and second interconnection lines 212 and 213 may be provided to cross the photoelectric conversion regions 110.

The optically-transparent layer 30 may include color filters 303a, 303b, and 303c and the micro lenses 307. The optically-transparent layer 30 may collect and filter externally incident light and then may provide the light to the photoelectric conversion layer 10.

That is, the color filters 303 and the micro lenses 307 may be provided on the second surface 100b of the substrate 100. The color filters 303a, 303b, and 303c may be provided on the unit pixels PX, respectively. The micro lenses 307 may be provided on the color filters 303a, 303b, and 303c, respectively. An anti-reflection layer 132 and first and second insulating layers 134 and 136 may be disposed between the second surface 100b of the substrate 100 and the color filters 303a, 303b, and 303c. The anti-reflection layer 132 may be configured to prevent light, which is incident into the second surface 100b of the substrate 100, from being reflected, and this may allow the incident light to be effectively incident into the photoelectric conversion regions 110. A third insulating layer 305 may be disposed between the color filters 303 and the micro lenses 307.

The color filters 303a, 303b, and 303c may include a first color filter 303a, a second color filter 303b, and a third color filter 303c. The first to third color filters 303a, 303b, and 303c may include primary color filters. As an example, the first to third color filters 303a, 303b, and 303c may include green, red, and blue color filters. In an embodiment, the first to third color filters 303a, 303b, and 303c may be arranged in a Bayer pattern. In an embodiment, the first to third color filters 303a, 303b, and 303c may include color filters of other colors (e.g., cyan, magenta, or yellow).

Each of the micro lenses 307 may have a convex shape capable of focusing the incident light on the unit pixel PX. When viewed in a plan view, the micro lenses 307 may be overlapped with the photoelectric conversion regions 110, respectively.

Figure 5:
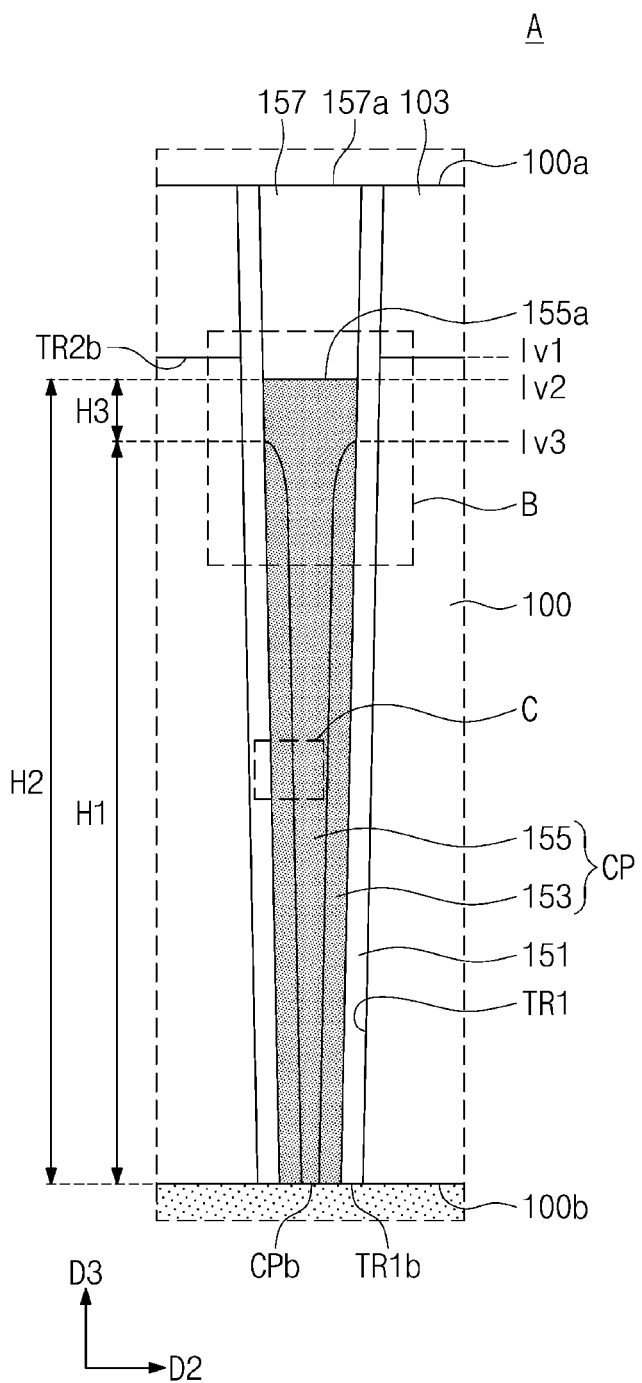
FIG. 5 is an enlarged sectional view further illustrating a region 'A' denoted in FIG. 4.
Figure 6:
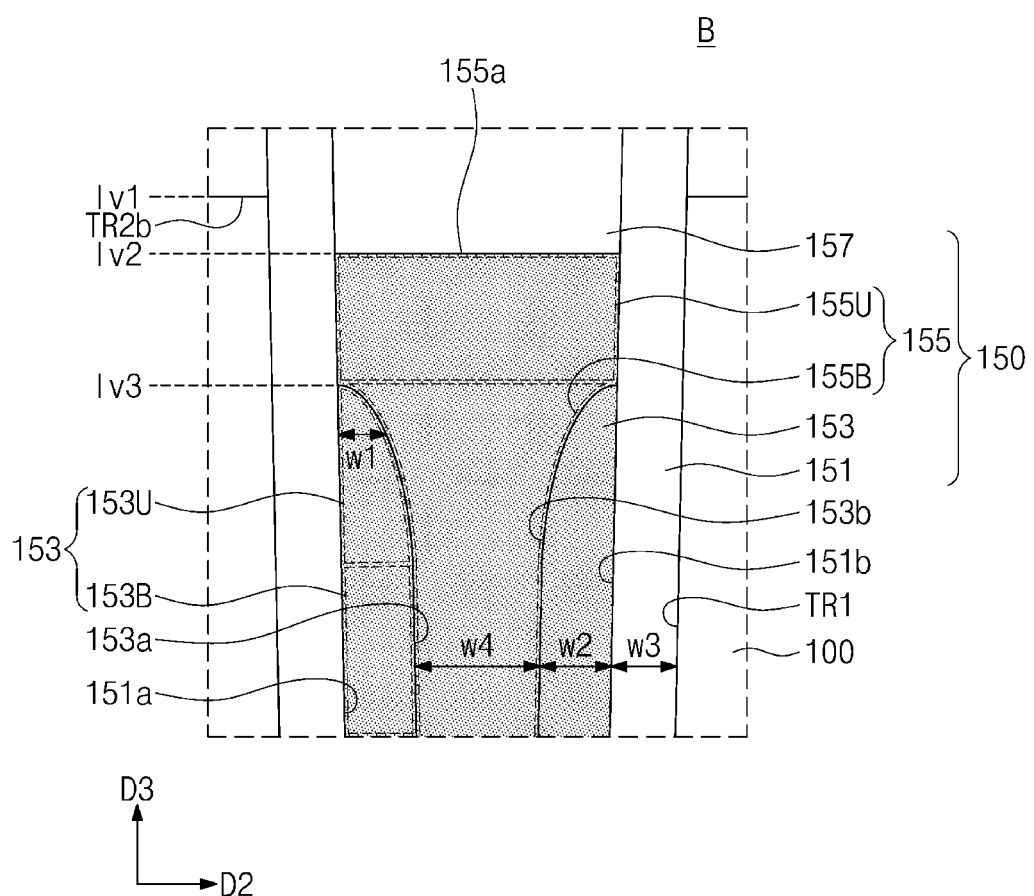
FIG. 6 is an enlarged sectional view further illustrating a region 13' denoted in FIG. 5.

FIG. 5 is an enlarged sectional view further illustrating the region 'A' denoted in FIG. 4, and FIG. 6 is an enlarged sectional view further illustrating the region 'B' denoted in FIG. 5. Hereinafter, the pixel isolation pattern 150 will be described in some additional detail.

Referring to FIGS. 5 and 6 in conjunction with FIG. 4, a first trench TR1 may be provided to penetrate the substrate 100 and to define the unit pixels PX. When viewed in a plan view, the first trench TR1 may have a lattice or grid structure. The pixel isolation pattern 150 may be provided in the first trench TR1 to fill an inner space of the first trench TR1. The pixel isolation pattern 150 may be provided to penetrate the device isolation pattern 103.

The pixel isolation pattern 150 may include a first oxide layer 151, a semiconductor pattern CP, and a capping pattern 157. The semiconductor pattern CP may include a first semiconductor layer 153 and a second semiconductor layer 155. The first oxide layer 151 may cover an inner side surface of the first trench TR1. The semiconductor pattern CP and the capping pattern 157 may fill the first trench TR1. For example, the capping pattern 157 may fill an upper region of the first trench TR1. The semiconductor pattern CP may fill the remaining region of the first trench TR1, except for the upper region of the first trench TR1.

The first oxide layer 151 may be provided on an inner side surface of the first trench TR1. The first oxide layer 151 may conformally cover the inner side surface of the first trench TR1. A thickness w3 of the first oxide layer 151 in the second direction D2 may be substantially uniform. For example, the thickness w3 may range from 30 □ to 350 □. When viewed in a cross-sectional view, the first oxide layer 151 may have a first inner side surface 151a and an opposing second inner side surface 151b. The first and second inner side surfaces 151a and 151b may be parallel to an inner side surface of the first trench TR1. The first oxide layer 151 may be extended from the first surface 100a of the substrate 100 to the second surface 100b. The first oxide layer 151 may be provided to surround each of the photoelectric conversion regions 110, when viewed in a plan view. The first oxide layer 151 may be interposed between the semiconductor pattern CP and the substrate 100. Although not shown, a plurality of oxide layers may be further provided on the first oxide layer 151. The semiconductor pattern CP may be spaced apart from the substrate 100 by the first oxide layer 151. The semiconductor pattern CP may be electrically disconnected from the substrate 100 by the first oxide layer 151. The first oxide layer 151 may be formed of or include a non-conductive material. As an example, the first oxide layer 151 may be formed of or include at least one of silicon oxide, silicon oxynitride, or silicon nitride.

The semiconductor pattern CP may include the first semiconductor layer 153 and the second semiconductor layer 155. The first semiconductor layer 153 may be provided on the first oxide layer 151. The first semiconductor layer 153 may conformally cover a portion of the first oxide layer 151. The first semiconductor layer 153 may not cover an upper portion of the first oxide layer 151. Accordingly, the upper portion of the first oxide layer 151 may be exposed by the first semiconductor layer 153. A level of the uppermost portion of the first semiconductor layer 153 may be a third level lv3. A vertical distance from the first surface 100a of the substrate 100 to the first semiconductor layer 153 may range from 50 nm to 2000 nm. The vertical distance from the first surface 100a of the substrate 100 to the first semiconductor layer 153 may mean a vertical distance from the first surface 100a to the third level lv3. A vertical distance from the first surface 100a of the substrate 100 to the second semiconductor layer 155 may mean a vertical distance from the first surface 100a to a second level lv2. The vertical distance from the first surface 100a of the substrate 100 to the first semiconductor layer 153 may be greater than the vertical distance from the first surface 100a of the substrate 100 to the second semiconductor layer 155. The first and second semiconductor layers 153 and 155 may be formed of or include poly silicon. As an example, the first and second semiconductor layers 153 and 155 may be formed of or include doped poly silicon. The first semiconductor layer 153 may be formed of (or include) N-type and/or P-type doped poly silicon. As another example, the first and second semiconductor layers 153 and 155 may be formed of or include undoped poly silicon. The first semiconductor layer 153 may have a first side surface 153a and a second side surface 153b facing each other. The first and second side surfaces 153a and 153b may be interfaces between the first and second semiconductor layers 153 and 155.

As shown in FIG. 6, the first semiconductor layer 153 may include a first portion 153U and a second portion 153B. The first portion 153U may be connected to the second portion 153B and may be provided on the first oxide layer 151. The first portion 153U may be closer to the first surface 100a than the second portion 153B. The first portion 153U may be an upper portion of the first semiconductor layer 153. The thickness w1 of the first portion 153U in the second direction D2 need not be uniform. That is, the thickness w1 of the first portion 153U in the second direction D2 may decrease with decreasing distance from the first surface 100a. For example, the thickness w1 of the first portion 153U of the first semiconductor layer 153 may be less near the first surface 100a of the substrate 100 than near the second surface 100b of the substrate 100. For example, the thickness w1 may range from about 10 □ to about 500 □. The thickness w1 in the second direction D2 may be a distance, in the second direction D2, between the first inner side surface 151a of the first oxide layer 151 and the first side surface 153a of the first semiconductor layer 153. Accordingly, the interfaces 153a and 153b of the first portion 153U may not parallel to the inner side surfaces 151a and 151b of the first oxide layer 151.

The second portion 153B may be connected to the first portion 153U and may be provided on the first oxide layer 151. The second portion 153B may be closer to the second surface 100b than the first portion 153U. The second portion 153B may be extended toward the second surface 100b. Accordingly, the bottom surface of the second portion 153B may be coplanar with the second surface 100b of the substrate 100. The second portion 153B may be a lower portion of the first semiconductor layer 153. The second portion 153B may have a substantially uniform thickness (e.g., w2) in the second direction D2. That is, the thickness w2 may become substantially uniform with decreasing distance to the first surface 100a or the second surface 100b. For example, the thickness w2 may range from between about 10 □ to about 500 □. The thickness w2 in the second direction D2 may be a distance between the first inner side surface 151a of the first oxide layer 151 and the first side surface 153a of the first semiconductor layer 153, measured in the second direction D2. Accordingly, the interfaces 153a and 153b of the second portion 153B may be parallel to the interface 151b of the first oxide layer 151.

The second semiconductor layer 155 may be provided on the first semiconductor layer 153 and the first oxide layer 151. The second semiconductor layer 155 may cover the first and second surfaces 153a and 153b of the first semiconductor layer 153 and the upper portion of the first oxide layer 151, which is exposed by the first semiconductor layer 153. The second semiconductor layer 155 may be formed of (or include) an N-type and/or P-type doped poly silicon. The second semiconductor layer 155 may be formed of or include the same material as the first semiconductor layer 153. The second semiconductor layer 155 may be interposed between the first and second side surfaces 153a and 153b of the first semiconductor layer 153 to fill an inner space of the first trench TR1. The second semiconductor layer 155 may be extended toward the second surface 100b of the substrate 100. The bottom surface of the second semiconductor layer 155 may be coplanar with the second surface 100b of the substrate 100 and the bottom surface of the first semiconductor layer 153.

A level of a top surface 155a of the second semiconductor layer 155 may be the second level lv2. The top surface 155a of the second semiconductor layer 155 may be located at a level between the bottom surface of the device isolation pattern 103 and the second surface 100b of the substrate 100. A thickness w4 of the second semiconductor layer 155 in the second direction D2 may increase with decreasing distance to the first surface 100a of the substrate 100. In other words, the thickness w4 of the second semiconductor layer 155 adjacent to the first surface 100a of the substrate 100 may be greater than the thickness w4 of the second semiconductor layer 155 adjacent to the second surface 100b of the substrate 100. Accordingly, a distance, in the second direction D2, between the first and second side surfaces 153a and 153b of the first semiconductor layer 153 may increase with decreasing distance to the first surface 100a of the substrate 100. In an embodiment, the thickness w4 may range from about 100 □ to about 2000 □.

As shown in FIG. 6, the second semiconductor layer 155 may include a first portion 155U and a second portion 155B. The first portion 155U may be connected to the second portion 155B. The first portion 155U may be closer to the capping pattern 157 than the second portion 155B. The first portion 155U may contact a capping pattern 137. The first portion 155U may be an upper portion of the second semiconductor layer 155. The first portion 155U may have a uniform thickness in the second direction D2. The second portion 155B may be connected to the first portion 155U and may be vertically extended toward the second surface 100b of the substrate 100. The second portion 155B may be closer to the second surface 100b of the substrate 100 than the first portion 155U. A bottom surface of the second portion 155B may be coplanar with the second surface 100b of the substrate 100. The second portion 155B may be a lower portion of the second semiconductor layer 155. A thickness of the second portion 155B in the second direction D2 need not be uniform. For example, the thickness of the second portion 155B in the second direction D2 may decrease with decreasing distance to the second surface 100b.

The capping pattern 157 may be provided on the top surface 155a of the second semiconductor layer 155. The capping pattern 157 may be disposed adjacent to the first surface 100a of the substrate 100. A top surface 157a of the capping pattern 157 may be coplanar with the first surface 100a of the substrate 100. A bottom surface of the capping pattern 157 may be substantially the same as the top surface 155a of the second semiconductor layer 155. The capping pattern 157 may be formed of or include a non-conductive material. For example, the capping pattern 157 may be formed of or include at least one of silicon oxide, silicon oxynitride, or silicon nitride.

In an embodiment, a first height H1 of the first semiconductor layer 153 may be less than a second height H2 of the second semiconductor layer 155. That is, the first height H1 may be a height of the first semiconductor layer 153 from the second surface 100b of the substrate 100. The first height H1 may be a height of the first semiconductor layer 153 from the bottom surface of the first trench TR1. The first height H1 may be a vertical distance from the second surface 100b of the substrate 100 to the third level lv3. The second height H2 may be a height of the second semiconductor layer 155 from the second surface 100b of the substrate 100. The second height H2 may be a height of the second semiconductor layer 155 from the bottom surface of the first trench TR1. The second height H2 may be a vertical distance from the second surface 100b of the substrate 100 to the second level lv2. Each of the first and second heights H1 and H2 may range from about 3 μm to about 8 μm. A third height H3 may be a difference between the first height H1 and the second height H2. The third height H3 may be a vertical distance from the top surface 155a of the second semiconductor layer 155 to the third level lv3. For example, the third height H3 may range from about 150 nm to about 1500 nm. In an embodiment, the second level lv2 and the third level lv3 may be positioned at levels lower than the bottom surface (e.g., the first level lv1) of the device isolation pattern 103. For example, the top surface 155a of the second semiconductor layer 155 and the uppermost portion of the first semiconductor layer 153 may be located at a level lower than the bottom surface of the device isolation pattern 103. A ratio between the vertical height H1 of the first semiconductor layer 153 and the vertical height of the pixel isolation pattern 150 may range from about ¾ to about ⅚. Here, the vertical height of the pixel isolation pattern 150 may be, for example, a vertical distance from the second surface 100b of the substrate 100 to the first surface 100a.

Figure 7:
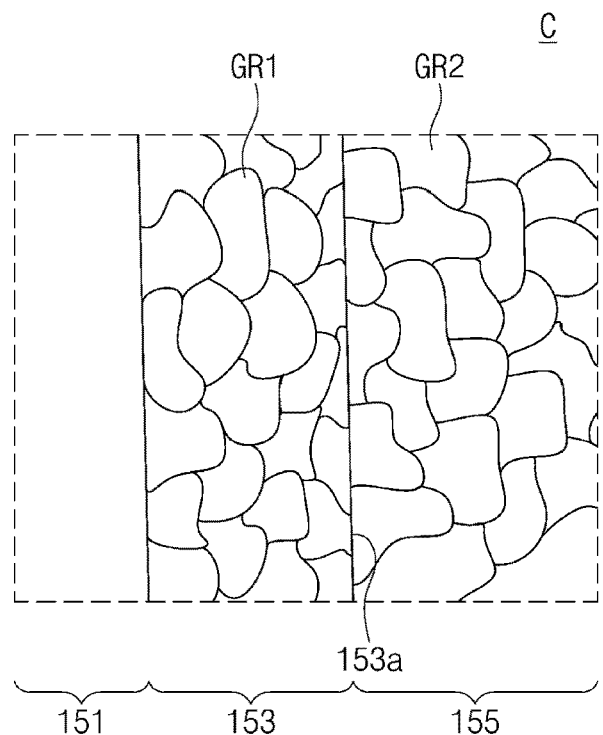
FIGS. 7 and 8 are enlarged sectional views further illustrating a region 'C' denoted in FIG. 5 and conceptually illustrating grains of first and second semiconductor layers.
Figure 8:
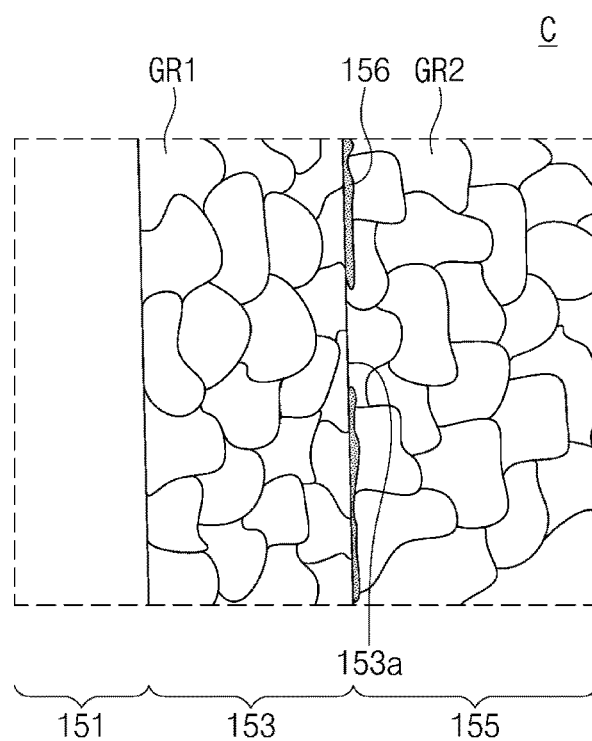

FIGS. 7 and 8 are enlarged sectional views conceptually illustrating the region 'C' denoted in FIG. 5 and further illustrate grain structures of the first and second semiconductor layers.

Referring to FIGS. 7 and 8, the first semiconductor layer 153 may include first grains GR1, and the second semiconductor layer 155 may include second grains GR2. The first and second semiconductor layers 153 and 155 may be formed by a process of depositing poly silicon. The first grains GR1 and the second grains GR2 may have mean grain sizes that are different from each other, according to a process condition in the deposition process.

As illustrated in FIG. 8, the image sensor may further include an oxide pattern 156, which is interposed between the first and second semiconductor layers 153 and 155. The oxide pattern 156 may be formed of or include silicon oxide. That is, the oxide pattern 156 may be formed by oxidizing a surface of the first semiconductor layer 153. In an embodiment, the oxide pattern 156 may partially cover the first and second side surfaces 153a and 153b of the first semiconductor layer 153. Alternately, the oxide pattern 156 may conformally cover the first semiconductor layer 153. In an embodiment, a plurality of the oxide patterns 156 may be provided. The oxide patterns 156 may be vertically spaced apart from each other. In an embodiment, the border between the first and second semiconductor layers 153 and 155 may be differentiated by the oxide pattern 156.

A conductive line may be provided on a peripheral region of the second surface 100b of the substrate 100. The conductive line may be electrically connected to the semiconductor pattern CP of the pixel isolation pattern 150. In an embodiment, the conductive line may directly contact a bottom surface CPb of the semiconductor pattern CP.

A negative voltage may be applied to the conductive line. As an example, the conductive line may be electrically connected to a charge pump, and thus, a negative voltage from the charge pump may be applied to the conductive line. The negative voltage may be a constant voltage. The negative voltage may be applied to the semiconductor pattern CP through the conductive line. Positive charge, which are produced in the unit pixels PX, may be removed through the semiconductor pattern CP surrounding the unit pixels PX. Thus, it may be possible to improve a dark current property of the image sensor.

A second trench TR2 may be provided to define the first to third active patterns ACT1, ACT2, and ACT3 of each of the unit pixels PX. The second trench TR2 may be extended from the first surface 100a toward the second surface 100b. The second trench TR2 may be shallower than the first trench TR1. The device isolation pattern 103 may fill the second trench TR2. A bottom surface of the pixel isolation pattern 150 may be closer to the second surface 100b of the device isolation pattern 103 than to the bottom surface of the device isolation pattern 103.

Figure 9:
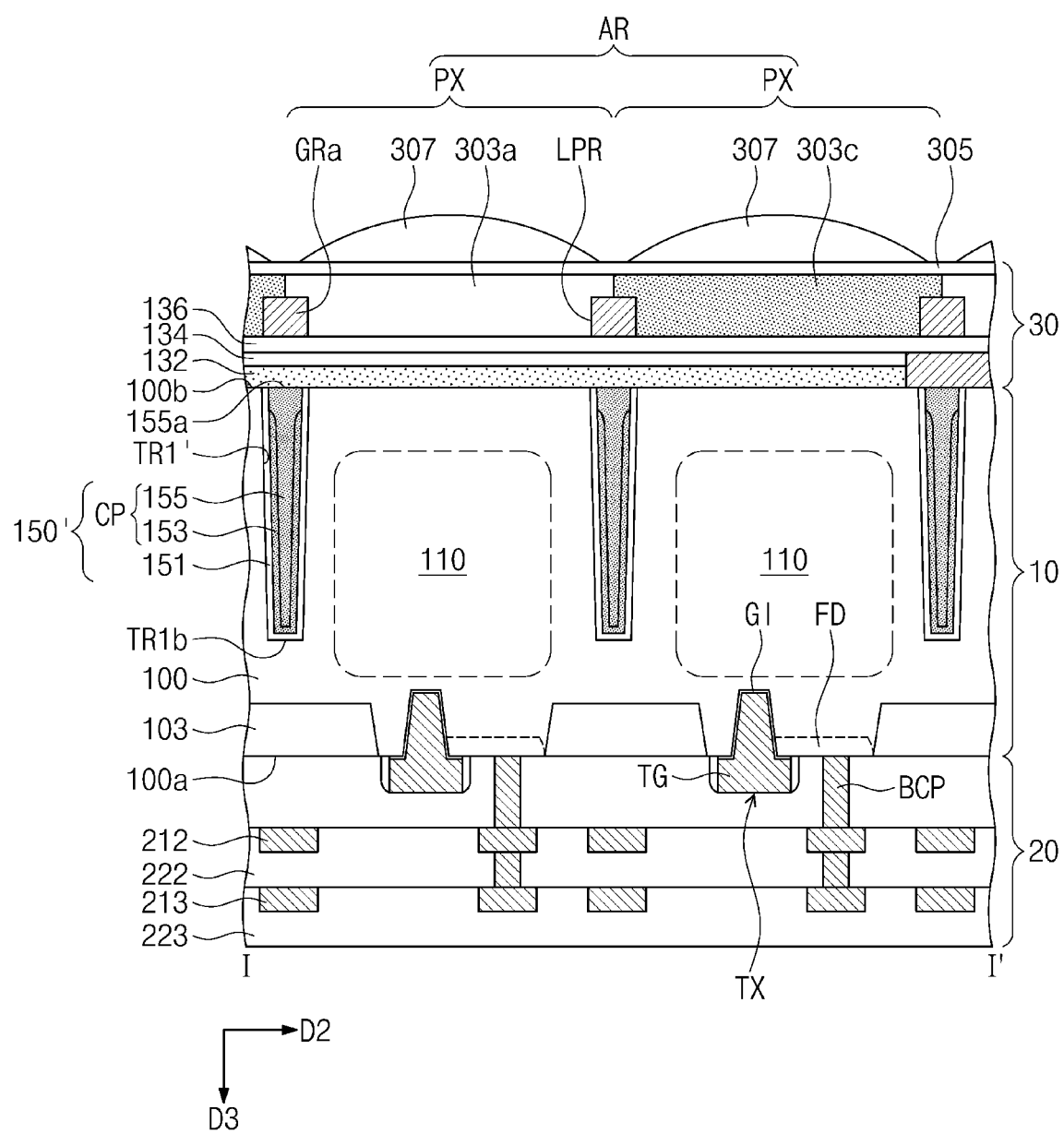
FIG. 9 is a sectional view illustrating an image sensor according to embodiments of the inventive concept.

FIG. 9 is a sectional view illustrating an image sensor according to embodiments of the inventive concept.

Referring to FIG. 9, a first trench TR1' may be provided to partially penetrate the substrate 100 and to define the unit pixels PX. The first trench TR1' may be extended from the second surface 100b of the substrate 100 toward the first surface 100a of the substrate 100. A bottom surface TR1b of the first trench TR1' may be placed between the first and second surfaces 100a and 100b of the substrate 100.

The pixel isolation pattern 150' may be provided in the first trench TR1' to fill an inner space of the first trench TR1'. The pixel isolation pattern 150' may include the first oxide layer 151 and the semiconductor pattern CP. When viewed in a sectional view parallel to the second and third directions D2 and D3, the pixel isolation pattern 150' may be extended from the second surface 100b of the substrate 100 toward the first surface 100a of the substrate 100. The pixel isolation pattern 150' may be provided to partially penetrate the substrate 100. Accordingly, a vertical height of the pixel isolation pattern 150' may be less than a vertical thickness of the substrate 100. In an embodiment, a width of the pixel isolation pattern 150 in the second direction D2 may gradually decrease in a direction from the second surface 100b of the substrate 100 toward the first surface 100a. The top surface 155a of the second semiconductor layer 155 may be coplanar with the second surface 100b of the substrate 100.

Figure 10:
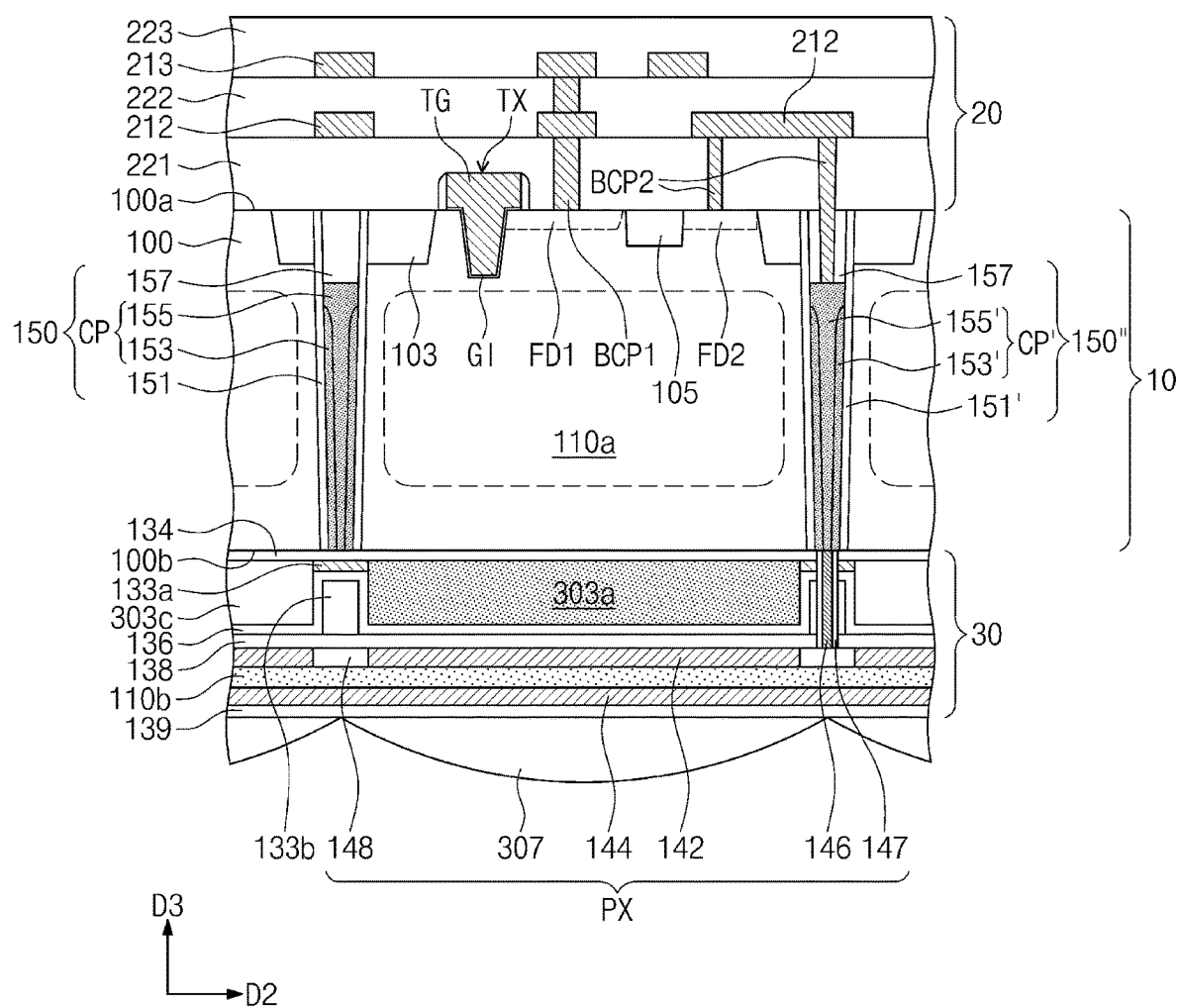
FIG. 10 is a sectional view illustrating an image sensor according to embodiments of the inventive concept.

FIG. 10 is a sectional view illustrating an image sensor according to embodiments of the inventive concept.

Referring to FIG. 10, the image sensor according to the present embodiment may include the first pixel isolation pattern 150 and a second pixel isolation pattern 150" penetrating the substrate 100. The second pixel isolation pattern 150" may be electrically disconnected from the first pixel isolation pattern 150.

The transfer gate TG may be disposed on the first surface 100a of the substrate 100. A first floating diffusion region FD1 may be disposed in the substrate 100 adjacent to the transfer gate TG. The first device isolation pattern 103 and a second device isolation pattern 105 may be disposed in the substrate 100. A second floating diffusion region FD2, which is spaced apart from the first floating diffusion region FD1 by the second device isolation pattern 105 in the substrate 100, may be disposed in the substrate 100. In the unit pixels PX, a first photoelectric conversion region 110a may be disposed in the substrate 100. The first photoelectric conversion region 110a may be a doped region of a second conductivity type.

The first insulating layer 134 may be disposed on the second surface 100b of the substrate 100. The color filters 303a and 303c may be formed on the first insulating layer 134 and may be respectively disposed in the unit pixels PX. A light-blocking pattern 133a may be formed on the first insulating layer 134 and between the color filters 303a and 303c. Side and top surfaces of the color filters 303a and 303c and a top surface of the light-blocking pattern 133a may be covered with the second insulating layer 136. A space (or gap) between the color filters 303a and 303c may be filled with a low refractive pattern 133b.

A third insulating layer 138 may be disposed on the second insulating layer 136 and the low refractive pattern 133b. The third insulating layer 138 may be a silicon oxide layer or a silicon nitride layer. A pixel electrode 142 may be disposed on the third insulating layer 138 and in each of the unit pixels PX. An insulating pattern 148 may be interposed between the pixel electrodes 142. The insulating pattern 148 may be a silicon oxide layer or a silicon nitride layer. A second photoelectric conversion layer 110b may be disposed on the pixel electrodes 142. A common electrode 144 may be disposed on the second photoelectric conversion layer 110b. A passivation layer 139 may be disposed on the common electrode 144. The micro lenses 307 may be disposed on the passivation layer 139.

The pixel electrode 142 and the common electrode 144 may be formed of or include at least one of indium-tin oxide (ITO), indium-zinc oxide (IZO), zinc oxide (ZnO), and/or organic transparent conductive materials. The second photoelectric conversion layer 110b may be, for example, an organic photoelectric conversion layer. The second photoelectric conversion layer 110b may include a P-type organic semiconductor material and an N-type organic semiconductor material, and the P-type and/or N-type organic semiconductor materials may form a P-N junction. Alternatively, the second photoelectric conversion layer 110b may include quantum dots or chalcogenide.

The pixel electrode 142 may be electrically connected to the second pixel isolation pattern 150" through a via plug 146. That is, the pixel electrode 142 may be electrically connected to the semiconductor pattern CP' of the second pixel isolation pattern 150". The semiconductor pattern CP' may be formed of or include at least one of, for example, doped polysilicon, metal nitrides (e.g., titanium nitride), metallic materials (e.g., tungsten, titanium, and copper), or transparent conductive materials (e.g., ITO). The via plug 146 may penetrate the third insulating layer 138, the low refractive pattern 133b, the second insulating layer 136, the light-blocking pattern 133a, and the first insulating layer 134 and may contact the second pixel isolation pattern 150". A side surface of the via plug 146 may be covered with a via insulating layer 147. The semiconductor pattern CP' may be electrically connected to the second floating diffusion region FD2 through interconnection structures 212 and BCP2.

FIGS. 11, 12, 13, 14, 15, 16, 17, 18 and 19 (hereafter, collectively "FIGS. 11 to 19") are related, sectional views taken along the line I-I' of FIG. 3 and illustrate in one example a method of fabricating an image sensor according to embodiments of the inventive concept. FIG. 20 is a plan view illustrating an image sensor according to embodiments of the inventive concept.

A method of fabricating an image sensor according to embodiments of the inventive concept may generally include preparing a substrate which includes a pixel region, an optically black region, and a pad region, and has two opposing, principal surfaces (e.g., a first surface and a second surface), forming a pixel isolation pattern, which is extended from the first surface toward the second surface, forming an interlayer insulating layer on the first surface, and forming interconnection lines in the interlayer insulating layer.

Figure 11:
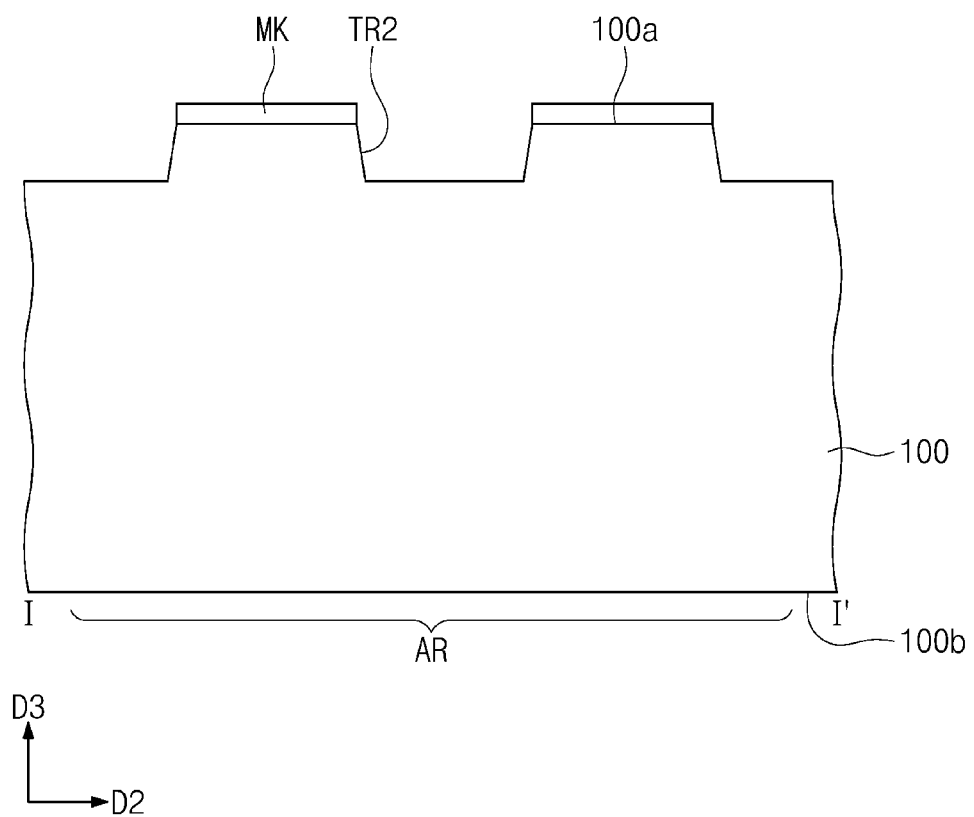
FIGS. 11, 12, 13, 14, 15, 16, 17, 18 and 19 are related sectional views taken along the line I-I' of FIG. 3 and illustrating in one example a method of fabricating an image sensor according to embodiments of the inventive concept.

Referring to FIGS. 11 and 20, the substrate 100 having the first surface 100a and an opposing second surface 100b may be prepared. The substrate 100 may include a pixel region AR, an optically black region OB, and a pad region PR. The substrate 100 may contain impurities of a first conductivity type (e.g., P-type). As an example, the substrate 100 may be a substrate, in which an epitaxial layer of the first conductivity type is formed on a bulk silicon wafer of the first conductivity type. As another example, the substrate 100 may be a bulk wafer including a well of the first conductivity type.

The second trench TR2 may be formed on the first surface 100*a* of the substrate 100. The formation of the second trench TR2 may include forming a mask pattern MK on the first surface 100*a* of the substrate 100 and performing an etching process on the first surface 100*a* using the mask pattern MK.

Figure 12:
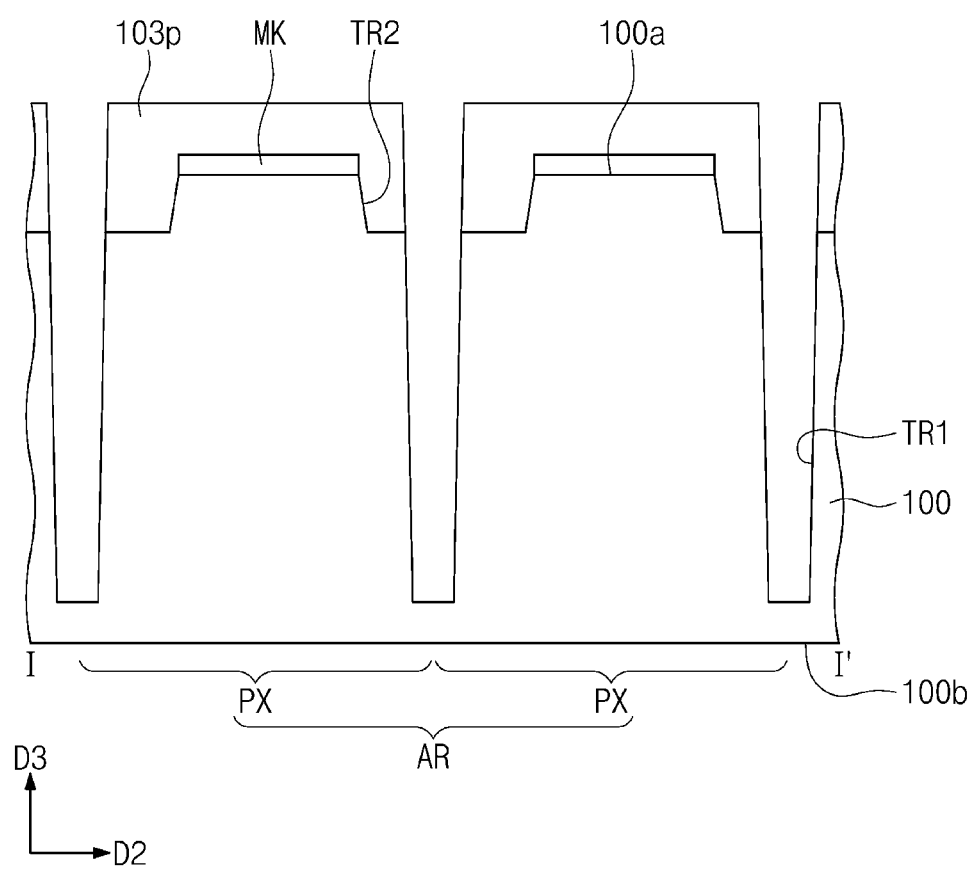

Referring to FIG. 12, the first trench TR1 may be formed on the first surface 100*a* of the substrate 100. Before the formation of the first trench TR1, a second preliminary pixel isolation pattern 103*p* may be formed on the first surface 100*a* of the substrate 100. The second preliminary pixel isolation pattern 103*p* may be formed by performing a deposition process on the first surface 100*a* of the substrate 100. The second preliminary pixel isolation pattern 103*p* may be formed to completely fill the second trench TR2 and to cover the mask pattern MK. A top surface of the second preliminary pixel isolation pattern 103*p* may be formed at a level that is higher than the first surface 100*a* of the substrate 100. The first trench TR1 may be formed by forming a mask (not shown) on the second preliminary pixel isolation pattern 103*p* and anisotropically etching the second preliminary pixel isolation pattern 103*p* and the substrate 100 using the mask. The bottom surface of the first trench TR1 may be located at a level that is higher than the second surface 100*b* of the substrate 100. The second preliminary pixel isolation pattern 103*p* may be formed of or include at least one of, for example, silicon oxide, silicon nitride, or silicon oxynitride.

Figure 13:
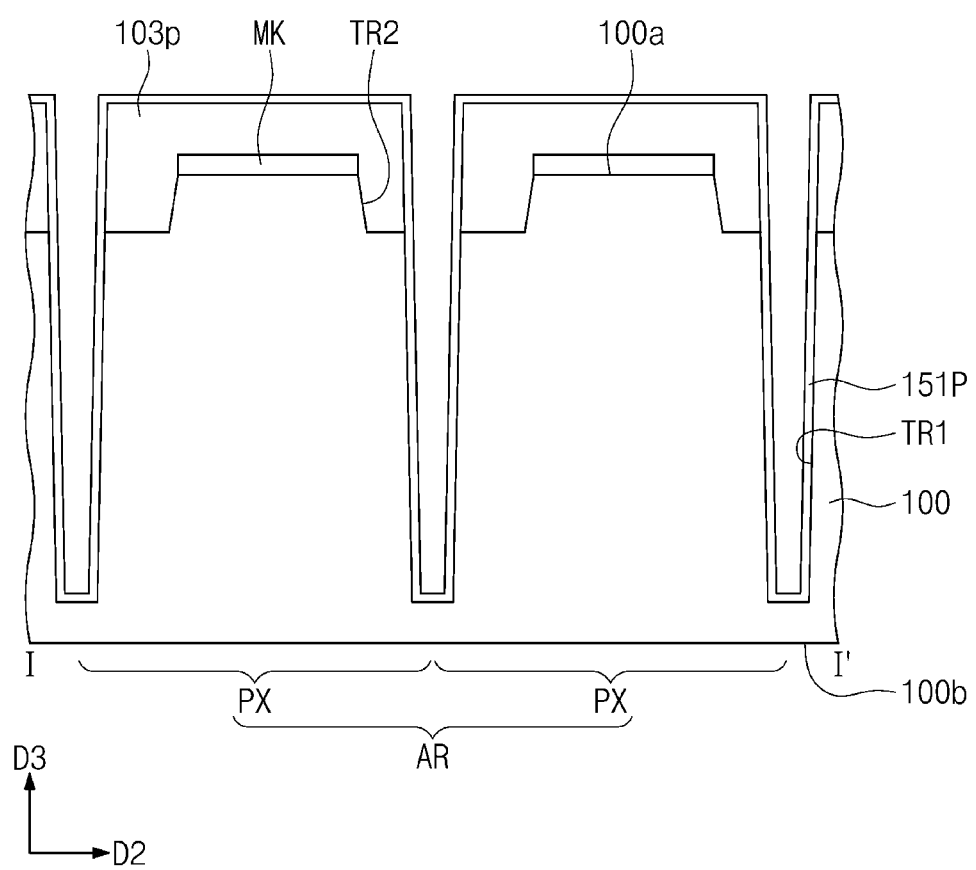

Referring to FIG. 13, a first preliminary oxide layer 151*p* may be formed to conformally cover an inner side surface of the first trench TR1. The first preliminary oxide layer 151*p* may cover an inner surface of the first trench TR1 and the top surface of the second preliminary pixel isolation pattern 103*p*. The first preliminary oxide layer 151*p* may be formed by depositing an insulating material on the substrate 100 provided with the first trench TR1. The first preliminary oxide layer 151*p* may be formed of or include at least one of, for example, silicon oxide, silicon nitride, or silicon oxynitride.

Figure 14:
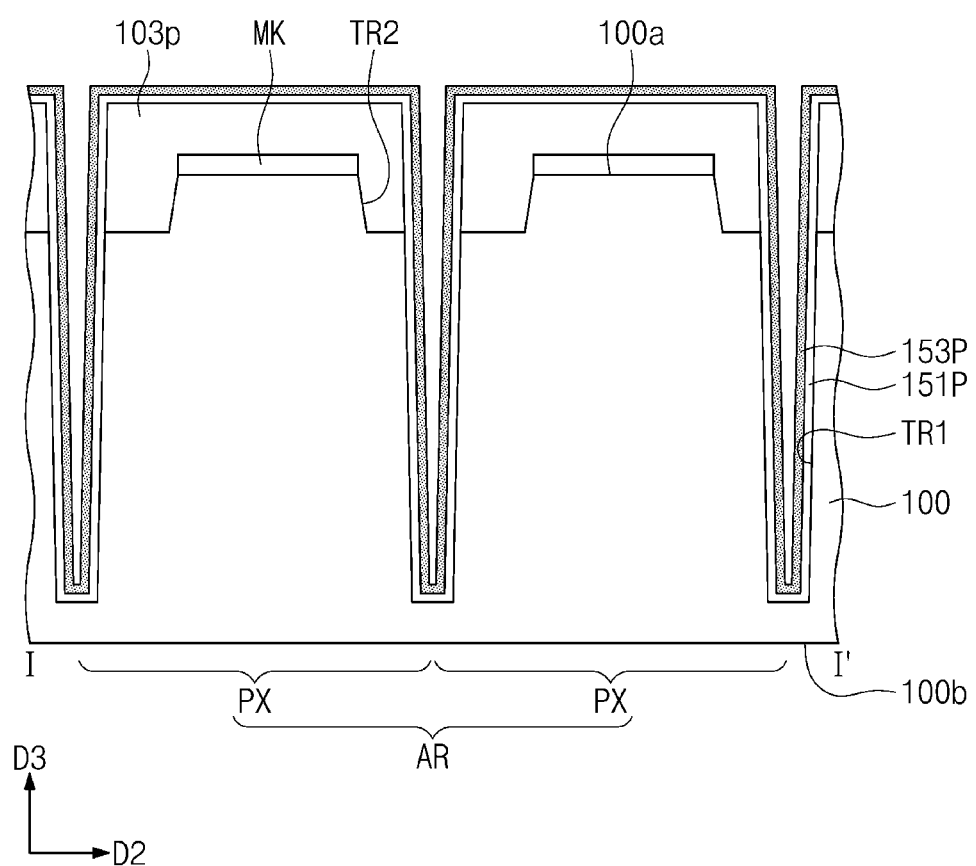

Referring to FIG. 14, a first preliminary semiconductor layer 153*p* may be formed on the first preliminary oxide layer 151*p*. The first preliminary semiconductor layer 153*p* may be formed by performing a first deposition process on the substrate 100 provided with the first preliminary oxide layer 151*p*. The first preliminary semiconductor layer 153*p* may cover the first preliminary oxide layer 151*p* on an inner side surface of the first trench TR1 and may cover the top surface of the second preliminary pixel isolation pattern 103*p*. The first preliminary semiconductor layer 153*p* may be formed of or include, for example, poly silicon.

Figure 15:
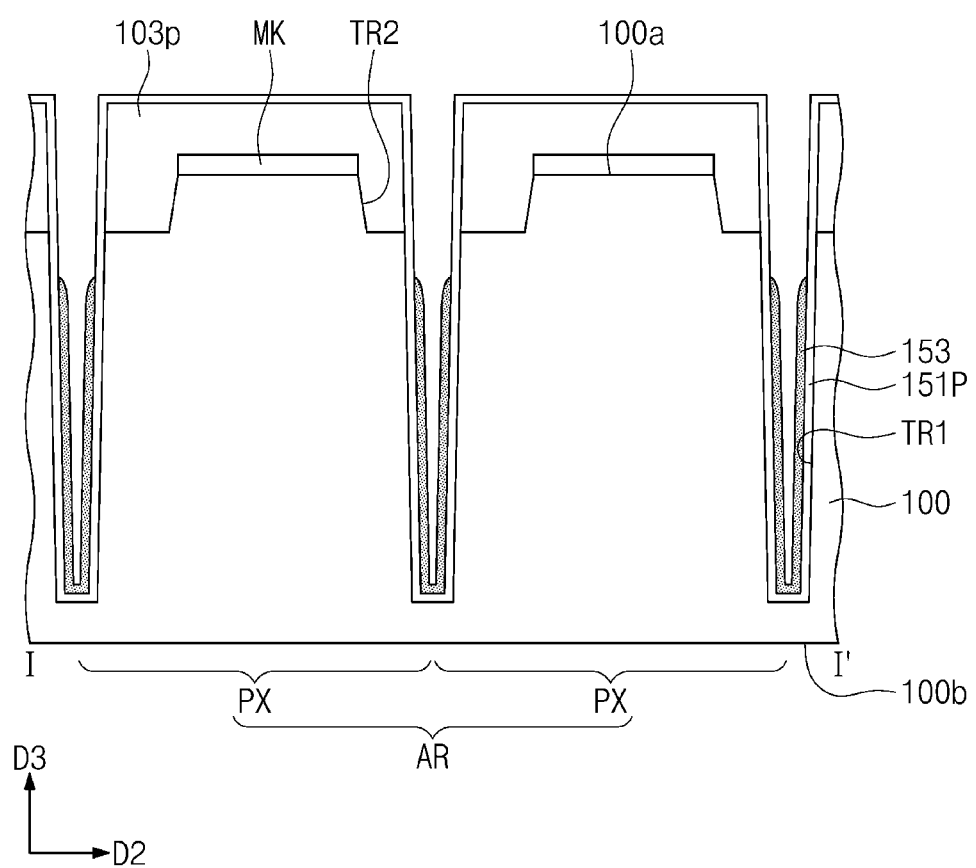

Referring to FIG. 15, a first etching process may be performed to remove an upper portion of the first preliminary semiconductor layer 153*p*, and as a result, the first semiconductor layer 153 may be formed. Accordingly, a portion of the first preliminary oxide layer 151*p* may be exposed to the outside. The etching process may be performed until the first semiconductor layer 153 is located at a level lower than a bottom surface of the second preliminary pixel isolation pattern 103*p*. Although not illustrated, the first etching process may be omitted. According to an embodiment, after the etching process, a doping process may be performed on the first semiconductor layer 153. The doping process may be, for example, a beam line ion implantation process or plasma doping (PLAD) process. In the case of the plasma doping process, a source material in a gaseous state may be supplied into a process chamber. The source material may be ionized using plasma, and then, the ionized source materials may be injected into the first semiconductor layer 153 by applying a bias of a high voltage to an electrostatic chuck (not shown), on which the substrate 100 is loaded. By using the plasma doping process, it may be possible to realize a uniform doping profile at a relatively deep depth and to improve a process speed of the doping process. In the case of the beam line ion implantation process, it may be difficult to uniformly dope the first semiconductor layer 153 in a vertical direction, because the first trench TR1 is relatively deep and narrow. Accordingly, if the doping process is performed by the beam line ion implantation process, the impurity concentration of the first semiconductor layer 153 may vary in a vertical direction. For example, an impurity concentration of an upper portion of the first semiconductor layer 153 may be higher than an impurity concentration of a lower portion of the first semiconductor layer 153.

In certain embodiments, the doping process may be performed on the first preliminary oxide layer 151*p*, before the formation of the first semiconductor layer 153. Accordingly, the first preliminary oxide layer 151*p* may contain impurities of a second conductivity type. In the present embodiment, a thermal treatment process may be performed after the formation of the first and second semiconductor layers 153 and 155. As a result of the thermal treatment process, the impurities in the first preliminary oxide layer 151*p* may be diffused into the first and second semiconductor layers 153 and 155. Thus, impurity concentrations of the first and second semiconductor layers 153 and 155 may be different. For example, an impurity concentration of the first semiconductor layer 153 may be higher than an impurity concentration of the second semiconductor layer 155.

Figure 16:
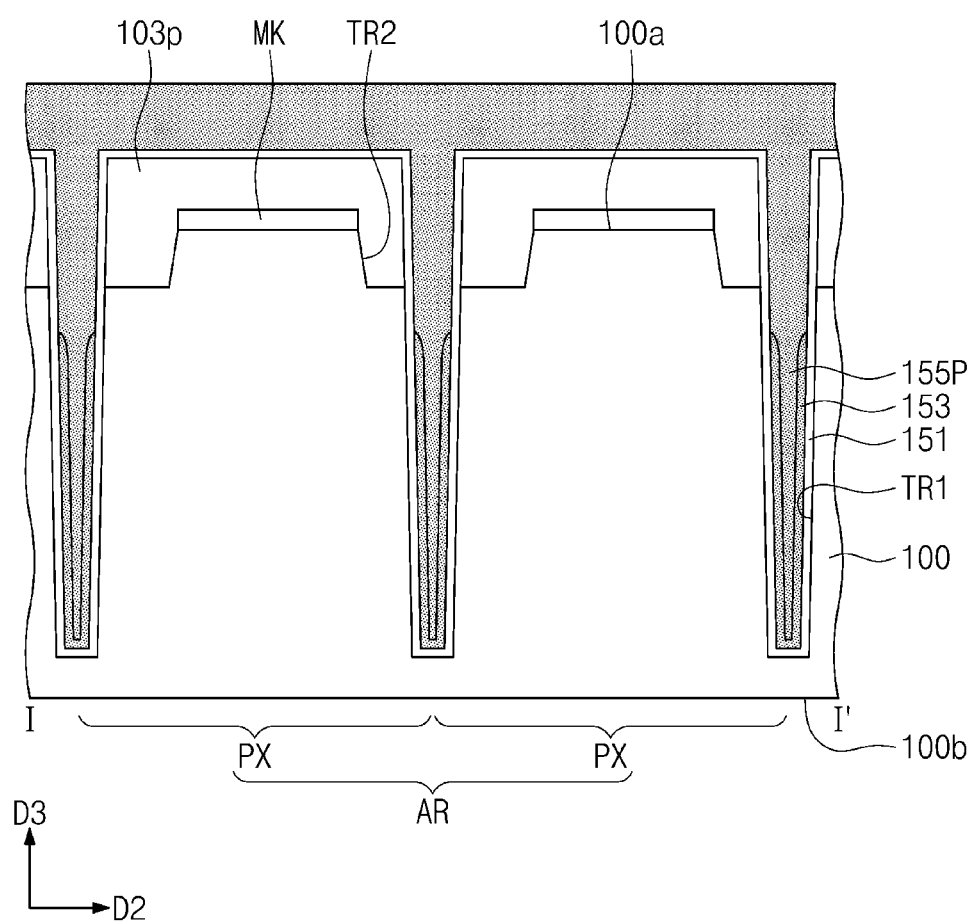

Referring to FIG. 16, a second preliminary semiconductor layer 155*p* may be formed on the first preliminary oxide layer 151*p* and the first semiconductor layer 153. The second preliminary semiconductor layer 155*p* may cover the first semiconductor layer 153 and the first preliminary oxide layer 151*p*. The second preliminary semiconductor layer 155*p* may be formed by performing a second deposition process on the first semiconductor layer 153 and the first preliminary oxide layer 151*p*. The second preliminary semiconductor layer 155*p* may be formed to completely fill the remaining region of the first trench TR1. The second preliminary semiconductor layer 155*p* may be formed of or include poly silicon.

In the image sensor device, if a negative voltage is applied to the semiconductor pattern CP filling the first trench TR1, a dark current property of the image sensor may be improved. In the case where the first trench TR1 is not densely filled with the semiconductor pattern CP and there is a void in the first trench TR1, the dark current property may be deteriorated. Thus, it may be necessary to prevent the void from being formed in the first trench TR1, when the semiconductor pattern CP is formed in the first trench TR1. In an embodiment, an etching process may be further performed to remove the upper portion of the first semiconductor layer 153, between the first and second deposition processes. In this case, it may be possible to increase an area of a top opening, through which the subsequent second deposition process will be performed, and this may make it possible to effectively supply a deposition material into a deep region (e.g., bottom surface) of the first trench TR1. Thus, it may be possible to prevent the void from being formed in the semiconductor pattern CP and thereby to realize an image sensor with improved reliability.

The second semiconductor layer 155 may be formed by performing a second etching process on the second preliminary semiconductor layer 155p. The second etching process may be, for example, an anisotropic etching process or an isotropic etching process. The isotropic etching process may be performed using a wet etching solution. For example, in the case where the second preliminary semiconductor layer 155p includes poly silicon, the second preliminary semiconductor layer 155p may be etched using a wet etching solution, in which hydrofluoric acid (HF), nitric acid ($HNO_3$), and acetic acid ($CH_3COOH$) are mixed.

Figure 17:
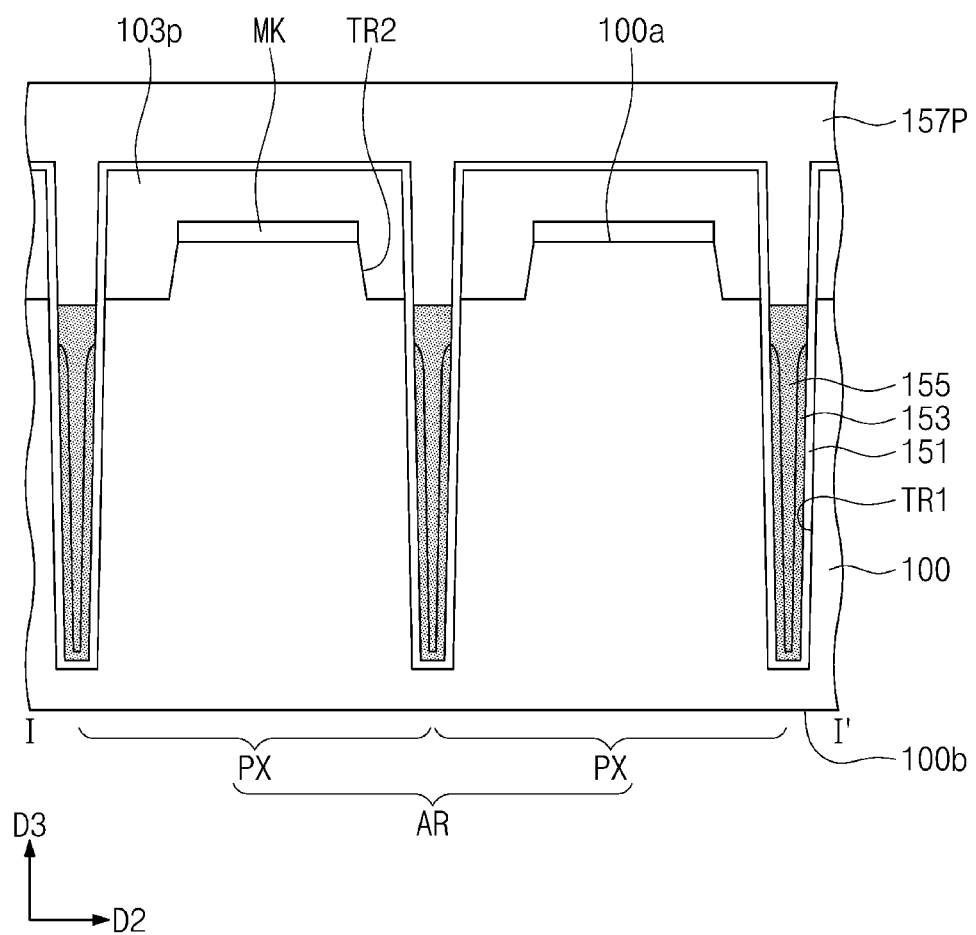

Referring to FIG. 17, a preliminary capping layer 157p may be formed to cover the entire top surface of the substrate 100 and to fill an upper portion of the first trench TR1. The formation of the preliminary capping layer 157p may include performing a deposition process on the first surface 100a of the substrate 100. The preliminary capping layer 157p may be formed of or include at least one of silicon oxide, silicon nitride, and/or silicon oxynitride.

Figure 18:
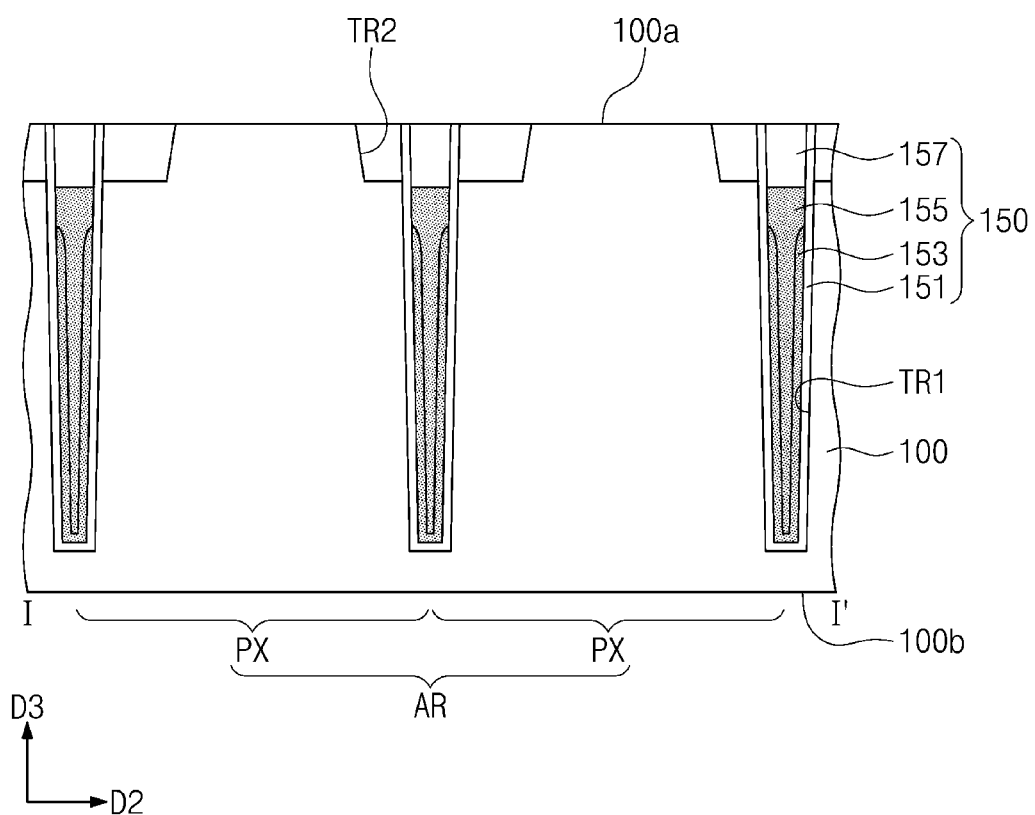

Referring to FIG. 18, the capping pattern 157 and the device isolation pattern 103 may be formed. The formation of the capping pattern 157 and the device isolation pattern 103 may include performing a planarization process on the first surface 100a of the substrate 100. In an embodiment, the mask pattern MK may be removed after the planarization process, and in this case, the first surface 100a of the substrate 100 may be prevented from being damaged. The photoelectric conversion regions 110 may be formed by doping impurities into the unit pixels PX. The photoelectric conversion regions 110 may have a second conductivity type (e.g., N-type), which is different from the first conductivity type (e.g., P-type).

Figure 19:
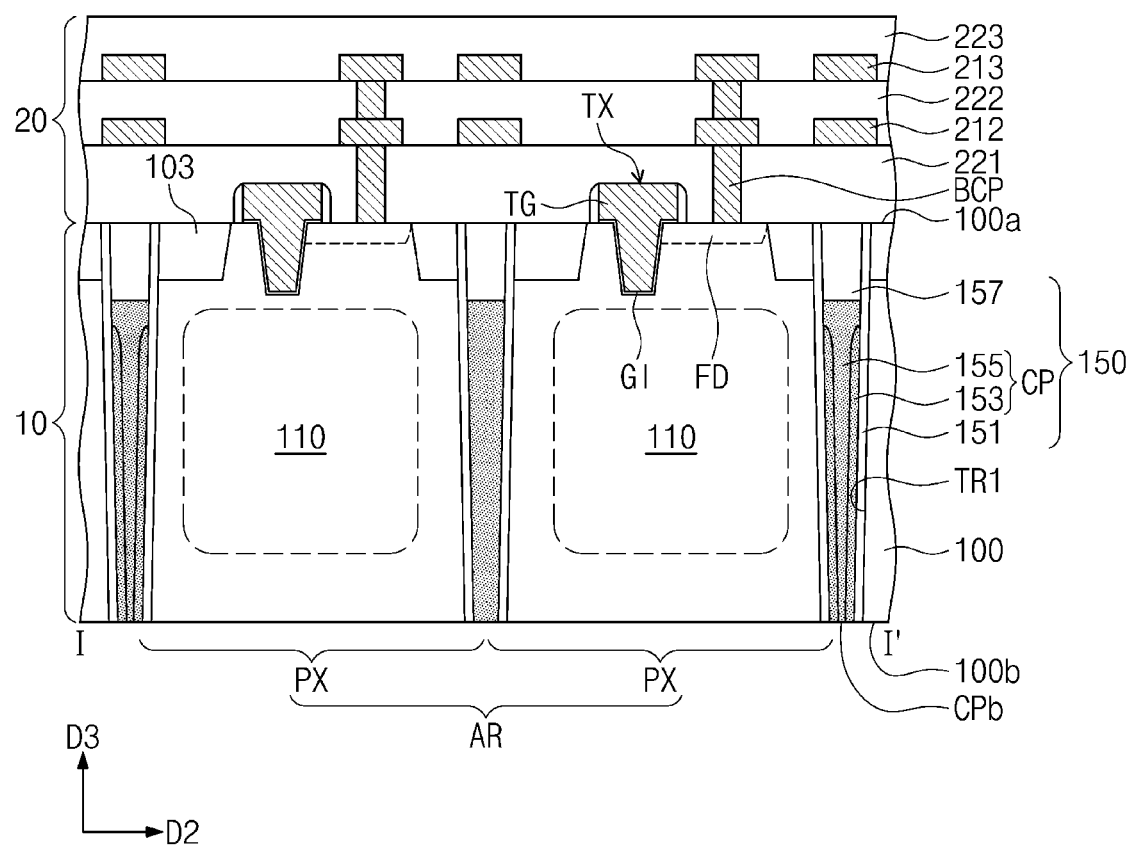
Figure 20:
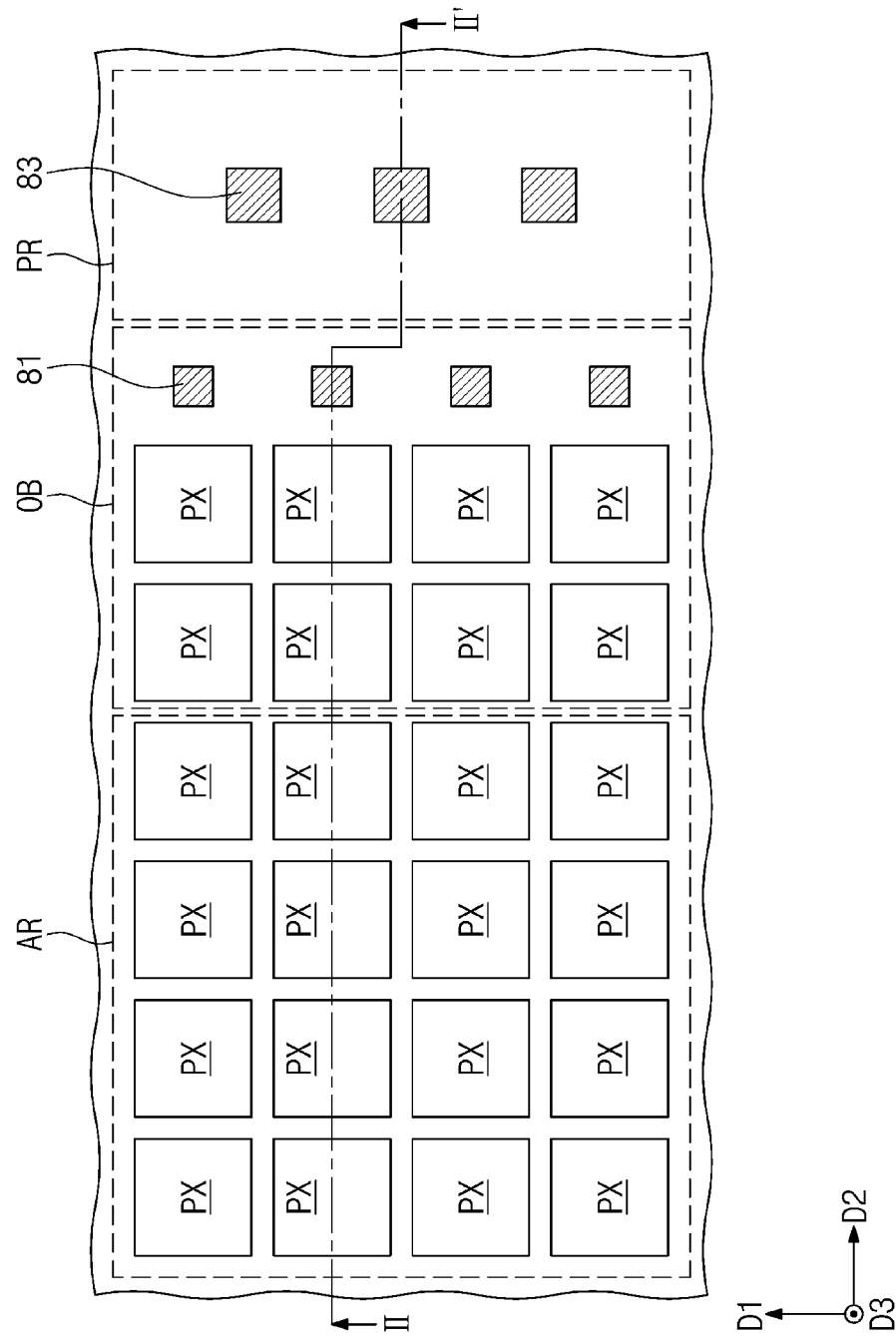
FIG. 20 is a plan view illustrating an image sensor according to embodiments of the inventive concept.

Referring to FIG. 19, a thinning process may be performed to remove a portion of the substrate 100 or to reduce a vertical thickness of the substrate 100. The thinning process may include grinding or polishing the second surface 100b of the substrate 100 and performing an anisotropic or isotropic etching process. The substrate 100 may be vertically inverted, for the thinning process. A portion of the substrate 100 may be removed by the grinding or polishing process, and thereafter, an anisotropic or isotropic etching process may be performed to remove surface defects from a surface of the substrate 100.

A thinning process on the second surface 100b of the substrate 100 may be performed to expose surfaces of the semiconductor pattern CP and the first oxide layer 151. The semiconductor pattern CP and the first oxide layer 151 may have bottom surfaces that are located at substantially the same level as the second surface 100b of the substrate 100.

Thereafter, the transfer transistor TX may be formed on the first active pattern ACT1 of each of the unit pixels PX, the drive transistor DX and the selection transistor SX may be formed on the second active pattern ACT2, and the reset transistor RX may be formed on the third active pattern ACT3.

That is, the formation of the transfer transistor TX may include doping the first active pattern ACT1 with impurities to form the floating diffusion region FD and forming the transfer gate TG on the first active pattern ACT1. The formation of the drive transistor DX and the selection transistor SX may include doping the second active pattern ACT2 with impurities to form an impurity region DR and forming a drive gate SFG and the selection gate SG on the second active pattern ACT2. The formation of the reset transistor RX may include doping the third active pattern ACT3 with impurities to form an impurity region DR and forming the reset gate RG on the third active pattern ACT3.

The first interlayer insulating layer 221 may be formed on the first surface 100a of the substrate 100. The first interlayer insulating layer 221 may be formed to cover the transfer transistors TX and the logic transistors RX, SX, and DX, which are formed on the first surface 100a of the substrate 100.

The second and third interlayer insulating layers 222 and 223 may be sequentially formed on the first interlayer insulating layer 221. The first and second interconnection lines 212 and 213 may be formed in the second and third interlayer insulating layers 222 and 223, respectively.

Referring back to FIG. 4, the anti-reflection layer 132, the first insulating layer 134, and the second insulating layers 136 may be sequentially formed on the second surface 100b of the substrate 100. The color filters 303a and 303c may be formed on the unit pixels PX, respectively. The micro lenses 307 may be formed on the color filters 303a and 303c, respectively.

Figure 21:
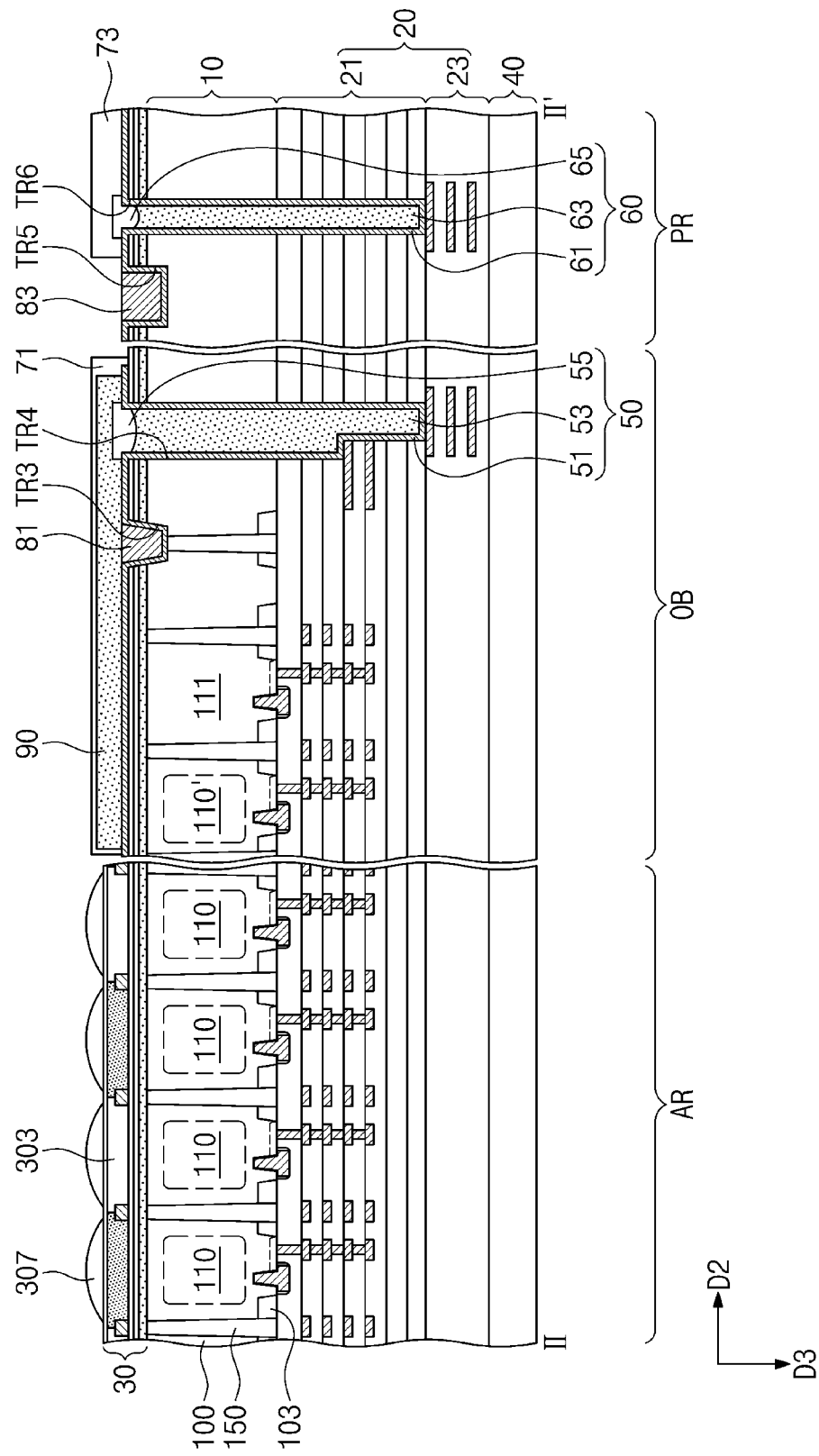
FIG. 21 is a sectional view taken along a line II-II' of FIG. 20.

FIG. 21 is a sectional view taken along a line II-IP of FIG. 20.

Referring to FIGS. 20 and 21, an image sensor according to embodiments of the inventive concept may include the substrate 100 with the pixel region AR, the optically black region OB, and the pad region PR, the interconnection layer 20 on the first surface 100a of the substrate 100, and a base substrate 40 on the interconnection layer 20. The interconnection layer 20 may include an upper interconnection layer 21 and a lower interconnection layer 23. The pixel region AR may include a plurality of the unit pixels PX. The pixel region AR may be substantially the same features as that described with reference to FIGS. 3 to 8.

In the optically black region OB, a first connection structure 50, a first contact 81, and a bulk color filter 90 may be provided on the substrate 100. The first connection structure 50 may include a first light-blocking pattern 51, an insulating pattern 53, and a first capping pattern 55.

Referring to FIG. 21 in conjunction with FIG. 4, the first light-blocking pattern 51 may be provided on the second surface 100b of the substrate 100. That is, the first light-blocking pattern 51 may cover the second insulating layer 136 on the second surface 100b and, in particular, may conformally cover inner surfaces of third and fourth trenches TR3 and TR4. The first light-blocking pattern 51 may be provided to penetrate the photoelectric conversion layer 10 and the upper interconnection layer 21 and to connect the photoelectric conversion layer 10 to the interconnection layer 20. That is, the first light-blocking pattern 51 may contact interconnection lines, which are provided in the upper interconnection layer 21 and the lower interconnection layer 23, and the pixel isolation pattern 150, which is provided in the photoelectric conversion layer 10. Accordingly, the first connection structure 50 may be electrically connected to interconnection lines in the interconnection layer 20. The first light-blocking pattern 51 may be formed of or include at least one of metallic materials (e.g., tungsten). The first light-blocking pattern 51 may block light, which is incident into the optically black region OB.

The first contact 81 may be provided in an inner region of the third trench TR3 to fill the remaining region of the third trench TR3. The first contact 81 may be formed of or include at least one of metallic materials (e.g., aluminum). The first contact 81 may be electrically connected to the semiconductor pattern CP. Accordingly, a bias may be applied to the semiconductor pattern CP through the first contact 81. The insulating pattern 53 may fill the remaining region of the fourth trench TR4. The insulating pattern 53 may be provided to completely or partially penetrate the photoelectric conversion layer 10 and the interconnection layer 20. The first capping pattern 55 may be provided on a top surface of the insulating pattern 53. The first capping pattern 55 may be provided on the insulating pattern 53. The first capping pattern 55 may be formed of or include the same material as the capping pattern 157 of FIG. 4.

The bulk color filter 90 may be provided on the first contact 81, the first light-blocking pattern 51, and the first capping pattern 55. The bulk color filter 90 may cover the first contact 81, the first light-blocking pattern 51, and the first capping pattern 55. A first protection layer 71 may be provided on the bulk color filter 90 to hermetically seal the bulk color filter 90.

The photoelectric conversion region 110' and a dummy region 111 may be provided on the optically black region OB of the substrate 100. The photoelectric conversion region 110' may be doped to have a second conductivity type that is different from the first conductivity type. The second conductivity type may be, for example, N-type. A pixel region AP may include a plurality of the unit pixels PX. The photoelectric conversion region 110' on the optically black region OB may have a structure similar to the photoelectric conversion region 110 on the pixel region AR but may not be used to execute the same operation (e.g., producing electrical signals by an incident light) as the photoelectric conversion region 110 on the pixel region AR. The dummy region 111 may not be doped with impurities. In an embodiment, signals, which are produced in the dummy region 111, may be used as information to remove a process noise.

A second connection structure 60, a second contact 83, and a second protection layer 73 may be provided on the pad region PR of the substrate 100. The second connection structure 60 may include a second light-blocking pattern 61, an insulating pattern 63, and a second capping pattern 65.

The second light-blocking pattern 61 may be provided on the second surface 100b of the substrate 100. That is, the second light-blocking pattern 61 may cover the second insulating layer 136 on the second surface 100b and may conformally cover inner surfaces of a fifth trench TR5 and a sixth trench TR6. The second light-blocking pattern 61 may be provided to penetrate the photoelectric conversion layer 10 and the upper interconnection layer 21 and to connect the photoelectric conversion layer 10 and the interconnection layer 20 to each other. That is, the second light-blocking pattern 61 may contact the interconnection lines in the lower interconnection layer 23. Accordingly, the second connection structure 60 may be electrically connected to the interconnection lines in the interconnection layer 20. The second light-blocking pattern 61 may be formed of or include at least one of metal materials (e.g., tungsten).

The second contact 83 may be provided in the fifth trench TR5 to fill the remaining region of the fifth trench TR5. The second contact 83 may be formed of or include at least one of metallic materials (e.g., aluminum). The second contact 83 may serve as a conduction path for an electric connection with an external device. The insulating pattern 63 may fill the remaining region of the sixth trench TR6. The insulating pattern 63 may be provided to completely or partially penetrate the photoelectric conversion layer 10 and the interconnection layer 20. The second capping pattern 65 may be provided on the insulating pattern 63. The second capping pattern 65 may be formed of or include the same material as the capping pattern 157 of FIG. 4. The second protection layer 73 may cover a portion of the second light-blocking pattern 61 and the second capping pattern 65.

A current, which is applied through the second contact 83, may be supplied to the pixel isolation pattern 150 through the second light-blocking pattern 61, the interconnection lines in the interconnection layer 20, and the first light-blocking pattern 51. Electrical signals, which are produced in the photoelectric conversion regions 110 and 110' and the dummy region 111, may be transmitted to the outside through the interconnection lines in the interconnection layer 20, the second light-blocking pattern 61, and the second contact 83.

According to embodiments of the inventive concept, an image sensor may include a pixel isolation pattern including a first semiconductor layer and a second semiconductor layer. Accordingly, a void may be removed from an inner space of a trench, which is formed in a substrate, and this may make it possible to improve reliability of the image sensor.

While example embodiments of the inventive concept have been particularly shown and described, it will be understood by one of ordinary skill in the art that variations in form and detail may be made therein without departing from the spirit and scope of the attached claims.

The invention claimed is:
1. An image sensor, comprising:
a substrate comprising a first surface and a second surface opposing to the first surface;
a first pixel region in the substrate;
a second pixel region in the substrate;
an isolation trench disposed between the first pixel region and the second pixel region, wherein the isolation trench penetrates the substrate;
a capping layer disposed in the isolation trench and in contact with the first surface; and
a pattern in the isolation trench and in contact with the capping layer;
wherein the pattern includes a second layer in the isolation trench and a first layer disposed between the second layer and an inner surface of the isolation trench,
wherein the first and second layers are in contact with the second surface and are spaced vertically apart from the first surface,
wherein a distance from a first surface of the capping layer to the first surface of the substrate is less than a distance from the second surface of the substrate to a first surface of the second layer,
wherein the capping layer is vertically overlapping with the pattern,
wherein the first surface of the capping layer is spaced apart from the first surface of the substrate,
wherein the first surface of the second layer is spaced apart from the first surface of the substrate,
wherein the capping layer includes a first material, and wherein the first layer includes a second material different from the first material,
wherein the image sensor is configured to receive light from the second surface of the substrate, and
wherein the first layer has a first side surface and a second side surface opposing the first side surface along a lateral direction, and
wherein the second side surface of the first layer has a first curved shape that curves from an inside of the isolation trench toward the inner surface of the isolation trench near the first surface of the capping layer.

2. The image sensor of claim 1, wherein the second layer has a second surface that has the first curved shape and is in contact with the second side surface of the first layer along the lateral direction.

3. The image sensor of claim 2, wherein the second surface of the second layer is spaced apart from the first surface of the capping layer.

4. The image sensor of claim 3, wherein the second layer includes the second material.

5. The image sensor of claim 3, wherein the first material is silicon oxide.

6. The imager sensor of claim 3, wherein the isolation trench has a first width at the first surface of the substrate in a first direction and the isolation trench has a second width at the second surface of the substrate in the first direction,
wherein the first width is greater than the second width, and
wherein the first direction is parallel to the first surface of the substrate.

7. The image sensor of claim 6, wherein the second layer has a third width in the first direction at a first vertical point,
wherein the first vertical point is disposed between the first surface of the second layer and the second surface of the substrate, and
wherein the third width is between 10 nm and 200 nm.

8. The image sensor of claim 7, wherein the first layer has a fourth width in the first direction at the first vertical point,
wherein the fourth width is from the first side surface of the first layer to the second side surface of the first layer and
wherein the third width is greater than the fourth width.

9. The image sensor of claim 8, wherein a distance from the first surface of the second layer to the second surface of the substrate in a vertical direction is about 3 µm to about 8 µm.

10. An image sensor, comprising:
a substrate comprising a first surface and a second surface opposing to the first surface;
a first pixel region in the substrate;
a second pixel region in the substrate;
an isolation trench disposed between the first pixel region and the second pixel region, wherein the isolation trench penetrates the substrate;
a capping layer disposed in the isolation trench and in contact with the first surface; and
a pattern in the isolation trench and in contact with the capping layer;
wherein the pattern includes a second layer and a first layer disposed between the second layer and an inner surface of the isolation trench,
wherein the first layer has a first surface in contact with the second surface of the substrate and a second surface opposing the first surface of the first layer along a vertical direction,
wherein a distance from a first surface of the second layer to the first surface of the substrate is different from a distance from the second surface of the first layer to the first surface of the substrate,
wherein the capping layer includes a first material, and wherein the first layer includes a second material different from the first material,
wherein the capping layer is vertically overlapping with the pattern,
wherein the first surface of the second layer is spaced vertically apart from the first surface of the substrate and the second surface of the first layer is spaced vertically apart from the first surface of the substrate,
wherein the image sensor is configured to receive light from the second surface of the substrate, and
wherein a distance from a first surface of the capping layer to the first surface of the substrate is less than a distance from the second surface of the substrate to the first surface of the second layer, and
wherein the first surface of the capping layer is spaced vertically apart from the first surface of the substrate.

11. The image sensor of claim 10, wherein the distance from the first surface of the capping layer to the first surface of the substrate is different from the distance from the second surface of the first layer to the first surface of the substrate.

12. The image sensor of claim 11, wherein the capping layer includes silicon oxide.

13. The image sensor of claim 11, wherein the first layer has a first side surface and a second side surface opposing the first side surface along a lateral direction, and
wherein the second side surface of the first layer has a first curved shape that curves from an inside of the isolation trench toward the inner surface of the isolation trench near the first surface of the capping layer.

14. The image sensor of claim 13, wherein the second layer has a second surface that has the first curved shape and is in contact with the second side surface of the first layer along the lateral direction.

15. The image sensor of claim 13, wherein the first layer has a first width in a first direction at a first vertical point,
wherein the second layer has a second width in the first direction at the first vertical point,
wherein the first vertical point is disposed between the first surface of the second layer and the second surface of the substrate, and
wherein the first direction is parallel to the first surface of the substrate.

16. The image sensor of claim 15,
wherein the first width is between 3 nm and 35 nm.

17. The image sensor of claim 16,
wherein the second width is greater than the first width.

18. An image sensor, comprising:
a substrate comprising a first surface and a second surface opposing to the first surface;
a first pixel region in the substrate;
a second pixel region in the substrate;
an isolation trench disposed between the first pixel region and the second pixel region, wherein the isolation trench penetrates the substrate;
a capping layer disposed in the isolation trench and in contact with the first surface; and
a pattern in the isolation trench and in contact the capping layer;
wherein the pattern includes a second layer in the isolation trench and a first layer disposed between the second layer and an inner surface of the isolation trench,
wherein the first and second layers are in contact with the second surface and are spaced apart from the first surface,
wherein a distance from a first surface of the capping layer to the first surface of the substrate is less than a distance from the second surface of the substrate to a first surface of the second layer, wherein the first layer has a first surface in contact with the second surface of the substrate and a second surface opposing the first surface of the first layer along a vertical direction, wherein the distance from the first surface of the capping layer to the first surface of the substrate is different from a distance from the second surface of the first layer to the first surface of the substrate, wherein the capping layer is vertically overlapping with the pattern, wherein the first surface of the capping layer is spaced apart from the first surface of the substrate, wherein the first surface of the second layer is spaced apart from the first surface of the substrate, wherein the capping layer includes a first material, and wherein the first layer includes a second material different from the first material, wherein the image sensor is configured to receive light from the second surface of the substrate, and wherein the first layer has a first side surface and a second side surface opposing the first side surface along a lateral direction, and wherein the second side surface of the first layer has a first curved shape that curves from an inside of the isolation trench toward the inner surface of the isolation trench near the first surface of the capping layer.

19. The image sensor of claim 18, wherein the second layer has a second surface that has the first curved shape and is in contact with the second side surface of the first layer along the lateral direction.

20. The image sensor of claim 19, wherein the isolation trench has a first width at the first surface of the substrate in a first direction and the isolation trench has a second width at the second surface of the substrate in the first direction, wherein the first width is greater than the second width, and wherein the first direction is parallel to the first surface of the substrate.

\* \* \* \* \*